(12) United States Patent
Okayama

(10) Patent No.: US 8,129,219 B2
(45) Date of Patent: Mar. 6, 2012

(54) SEMICONDUCTOR MODULE, METHOD FOR MANUFACTURING THE SEMICONDUCTOR MODULE AND PORTABLE DEVICE CARRYING THE SAME

(75) Inventor: Yoshio Okayama, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 694 days.

(21) Appl. No.: 11/863,647

(22) Filed: Sep. 28, 2007

(65) Prior Publication Data

US 2008/0079151 A1  Apr. 3, 2008

(30) Foreign Application Priority Data

Sep. 29, 2006 (JP) ................................ 2006-267063
Sep. 19, 2007 (JP) ................................ 2007-242222

(51) Int. Cl.
*H01L 21/00* (2006.01)

(52) U.S. Cl. ........ 438/106; 438/110; 438/112; 438/113; 438/121; 438/124; 257/E23.06; 257/E23.13; 257/E23.17

(58) Field of Classification Search ................ 438/106, 438/110, 112, 113, 121, 124; 257/E23, E23.06, 257/E23.1, E23.13, E23.17
See application file for complete search history.

(56) References Cited

U.S. PATENT DOCUMENTS

| | | | | |
|---|---|---|---|---|
| 5,915,753 | A * | 6/1999 | Motomura et al. | 29/830 |
| 6,271,469 | B1 * | 8/2001 | Ma et al. | 174/521 |
| 6,353,989 | B1 * | 3/2002 | Jackel et al. | 29/456 |
| 6,475,877 | B1 * | 11/2002 | Saia et al. | 438/460 |
| 6,646,337 | B2 * | 11/2003 | Iijima et al. | 257/700 |
| 6,701,614 | B2 * | 3/2004 | Ding et al. | 29/848 |
| 6,929,974 | B2 * | 8/2005 | Ding et al. | 438/106 |
| 7,341,888 | B2 * | 3/2008 | Nam et al. | 438/106 |

FOREIGN PATENT DOCUMENTS

| | | |
|---|---|---|
| CN | 1377219 | 10/2002 |
| CN | 1411043 | 4/2003 |
| CN | 1682363 | 10/2005 |
| JP | 09-289264 | 11/1997 |
| JP | 2004-193297 | 7/2004 |

OTHER PUBLICATIONS

Communication issued by the State Intellectual Property Office of People's Republic of China on Mar. 1, 2010 in Application No. 200710307782.3.

* cited by examiner

*Primary Examiner* — Thao Le
*Assistant Examiner* — Eric Jones
(74) *Attorney, Agent, or Firm* — Fish & Richardson P.C.

(57) ABSTRACT

In a semiconductor module where a metal sheet, an insulating layer and a circuit element are stacked in a manner that the insulating layer is penetrated with a bump structure, the connection reliability of the bump structure and the circuit element is enhanced. A semiconductor wafer is prepared where a semiconductor substrate having electrodes and protective film on the surface are arranged in a matrix shape. On the surface of the semiconductor substrate, an insulating layer is held between the substrate and a copper sheet, integrally formed with bumps, having grooves in the vicinity of the bumps. The semiconductor substrate, the insulating layer and the copper sheet are press-bonded by a press machine into a single block. The bump penetrates the insulating layer, and the bump and the electrode are electrically connected together. An extra part of the insulating layer pushed out by the bump flows into the groove.

7 Claims, 26 Drawing Sheets

SEMICONDUCTOR MODULE, METHOD FOR MANUFACTURING THE SEMICONDUCTOR MODULE AND PORTABLE DEVICE CARRYING THE SAME

CROSS-REFERENCE TO RELATED APPLICATIONS

This application is based upon and claims the benefit of priority from the prior Japanese Patent Applications No. 2006-267063, filed Sep. 29, 2006, and Japanese Patent Application No. 2007-242222, filed Sep. 19, 2007, the entire contents of which are incorporated herein by reference.

BACKGROUND OF THE INVENTION

1. Field of the Invention

The present invention relates to a semiconductor module and a method for making the same.

2. Description of the Related Art

There is a type of semiconductor module called a CSP (Chip Size Package) among the conventional semiconductor modules. A semiconductor module of CSP type is produced by a process in which a semiconductor wafer (semiconductor substrate) with LSIs (circuit elements) and external connection electrodes connected thereto formed on the main face thereof is diced into individual modules. Therefore, a semiconductor module can be fixed onto a wiring substrate in a size practically the same as an LSI chip. This helps realize the miniaturization of a wiring substrate on which the semiconductor module is mounted.

In recent years, following the trend of electronic devices towards miniaturization and higher performance, demand has been ever greater for further miniaturization of semiconductor modules which are used in them. To realize such miniaturization of semiconductor modules, it is of absolute necessity that the pitch of electrodes that allow packaging on wiring substrate be made narrower. A known method of surface-mounting a semiconductor module is flip chip mounting in which solder bumps are formed on external connection electrodes of circuit elements and the solder bumps are soldered to an electrode pad of a wiring substrate. With this method, however, there are restrictive factors for the narrowing of the pitch of external connection electrodes, such as the size of the solder bump itself and the bridge formation at soldering. A way used to overcome these limitations in recent years has been the rearrangement of external connection electrodes by forming a rewiring of the circuit elements. For example, in a known method for such rearrangement, a bump structure formed by half-etching a metal plate is used as an electrode or a via, and external connection electrodes of the circuit elements are connected to the bump structure by mounting the circuit elements on the metal plate through an insulating layer of an epoxy resin or the like.

In a conventional technology, a semiconductor wafer (semiconductor substrate) is formed by stacking a metal sheet, an insulating layer and a circuit element in such a manner that bump structures are embedded in the insulating layer. In this state, because of the low fluidity of the insulating layer, there is little room for the resin pushed out by the bump structures to escape into, especially near the center of the semiconductor wafer. This presents a problem of reduced connection reliability of the rewiring portions because a residual film of resin stays on at an interface between the bump structures and the opposing electrodes of the circuit element.

SUMMARY OF THE INVENTION

The present invention has been made in view of the foregoing circumstances, and a general purpose thereof is to provide a technology for improving the connection reliability between bump structures and opposing electrodes of a circuit element in a semiconductor module which is formed by stacking a metal sheet, an insulating layer and a circuit element in such a manner that the bumps are embedded in the insulating layer.

One embodiment of the present invention relates to a method for manufacturing a semiconductor module or modules. The method for manufacturing a semiconductor module comprises: a first process of preparing a semiconductor substrate in which a circuit element and an electrode electrically connected to the circuit element are provided on a surface thereof; a second process of forming a metal sheet having a bump on a main surface and a first groove provided on the main surface; and a third process of press-bonding the metal sheet and the semiconductor substrate by way of an insulating layer and electrically connecting the bump with the electrode in a manner such that the bump penetrates the insulating layer.

According to this embodiment, extra material of the insulating layer pushed out by the bump flows into the groove. As a result, the probability that the residual film of insulating layer 7 will remain at an interface between the bump and the electrode of the semiconductor substrates 1 is suppressed. Thus, it is possible to easily manufacture semiconductor modules characterized by improved connection reliability between the bump and the electrode.

In the above structure, a plurality of circuit elements are preferably provided on the semiconductor substrate, and the first groove is preferably formed on a scribe region which is so provided as to demarcate the plurality of circuit elements. The scribe lines are generally a lattice-like region enclosing a plurality of circuit elements formed vertically and horizontally on the surface of a semiconductor wafer (semiconductor substrate) in such a manner as to demarcate them into individual circuit elements. And they are the region that will be removed as a result of dicing of the semiconductor wafer (semiconductor substrate) into individual modules. Hence, it is possible to provide the first groove in the scribe lines without giving consideration to the layout of a wiring layer such as electrodes of the circuit element. Moreover, a common type of grooves may be used in the manufacture of different kinds of circuit elements. As a result, semiconductor modules with improved connection reliability can be produced at lower cost.

In the above structure, the electrode is preferably provided in a peripheral part of the circuit element. The electrode is formed in the peripheral part (near the scribe lines) keeping away from the region where an integrated circuit is formed, and the first groove is formed within the scribe line. This arrangement makes it easier for extra part of the insulating layer to flow into the first groove. As a result, the possibility that the residual film of insulating layer will remain at the interface between the bump and the electrode is effectively suppressed.

The method may further comprise a fourth process of forming a wiring layer having a predetermined line/space pattern by processing the metal sheet, wherein the first groove may be formed in a shape corresponding to the space pattern of the wiring layer, and the wiring layer may be formed by making the metal sheet thinner from a rear surface thereof. According to this embodiment, a wiring layer having a predetermined line/space pattern can be formed self-alignedly according to the space pattern of the first groove. Thus, there is no need for the lithography and etching process to form the wiring layer by processing the metal sheet. As a result, semiconductor modules characterized by improved connection reliability between the bumps and the electrodes can be produced at lower cost.

In the above structure, the first groove may be formed by penetrating the metal sheet. In such a case, extra part of the insulating layer flows out externally by way of the first groove which penetrate the metal sheet. As a result, the possibility that the residual film of insulating layer will remain at the interface between the bump and the electrode is further effectively suppressed.

In the above structure, it is preferably that a second groove be further provided on the surface of the semiconductor substrate in the first process. With the provision of the second groove, extra part of the insulating layer flows into the first groove and the second groove, so that the possibility that the residual film of insulating layer will remain at the interface between the bump and the electrode is more effectively suppressed. As a result, semiconductor modules characterized by improved connection reliability between the bumps and the electrodes can be produced more easily.

Another embodiment of the present invention relates also to a method for manufacturing a semiconductor module or modules. The method for manufacturing a semiconductor module comprises: a first process of preparing a semiconductor substrate in which a circuit element, an electrode electrically connected to the circuit element and a groove are provided on a surface thereof; a second process of forming a metal sheet having a bump; and a third process of press-bonding the metal sheet and the semiconductor substrate by way of an insulating layer and electrically connecting the bump with the electrode in a manner such that the bump penetrates the insulating layer and embed the grooves with part of the insulating layer.

According to this embodiment, part of the insulating layer pushed out by the bump flows into the second groove, so that the possibility that the residual film of insulating layer will remain at the interface between the bump and the electrode is suppressed. As a result, semiconductor modules characterized by improved connection reliability between the bumps and the electrodes can be produced easily.

Still another embodiment of the present invention relates to a semiconductor module. This semiconductor module comprises: a wiring layer integrally formed with a bump on a main surface; a circuit element provided with an electrode connected electrically with the bump and an insulating layer between the wiring layer and the circuit element, wherein the wiring layer has a groove on the main surface, and the groove is filled with the insulating layer.

Still another embodiment of the present invention relates also to a semiconductor module. This semiconductor module comprises: a wiring layer integrally formed with a bump on from a main surface; a circuit element provided with an electrode coupled electrically with the bump; an insulating layer between the wiring layer and the circuit element; and an intermediate provided between the main surface of the wiring layer and the insulating layer, wherein the intermediate layer has a groove on a surface in contact with the insulating layer and a recessed portion thereof is filled with the insulating layer.

Still another embodiment of the present invention relates a portable device. This portable device includes a semiconductor module according to any of the above-described embodiments.

It is to be noted that any arbitrary combinations or rearrangement of the aforementioned structural components and so forth are all effective as and encompassed by the embodiments of the present invention.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

Figure 1:
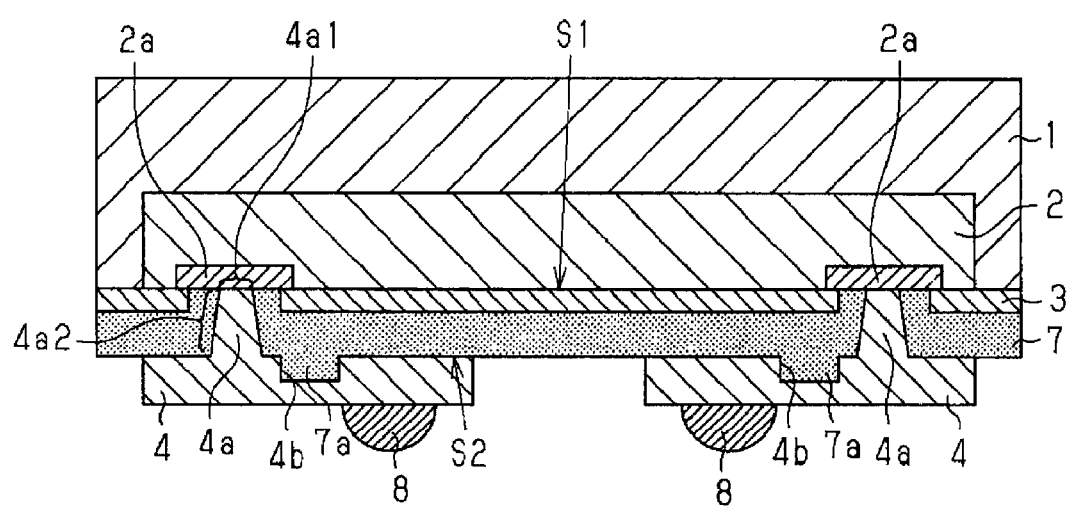
FIG. 1 is a schematic cross-sectional view showing a semiconductor module according to a first embodiment of the present invention.

The invention will now be described by reference to the preferred embodiments. This does not intend to limit the scope of the present invention, but to exemplify the invention.

Hereinbelow, the embodiments will be described with reference to the accompanying drawings. Note that in all of the Figures the same reference numerals are given the same components and the description thereof is omitted as appropriate.

First Embodiment

FIG. 1 is a schematic cross-sectional view showing a semiconductor module according to a first embodiment of the present invention. Referring to FIG. 1, a semiconductor module according to the first embodiment will now be described.

A semiconductor substrate 1 to be employed is a p-type silicon substrate or the like. A circuit element 2, such as a predetermined electric circuit, is formed on a surface S1 (bottom side) of the semiconductor substrate 1 by a known technology, and also electrodes 2a of the circuit element 2 are formed on the surface S1 (particularly in a peripheral part thereof), which is a packaging surface. A protective film 3 is formed on the area of the surface of the semiconductor substrate 1 except that of the electrodes 2a. On the surface S1 (bottom side) of the semiconductor substrate 1, an insulating layer 7 is formed on the electrodes 2a and the protective film 3 with the purpose of making the pitch of the electrodes 2a wider. And bumps (projecting conductor portions) 4a, which penetrate the insulating layer 7 and connect to the exposed surface of the electrodes 2a, and a rewiring pattern (wiring layer) 4, which is provided integrally with the bump 4a, is formed on the main surface S2 side. The rewiring pattern 4 is also provided with a groove 4b, which is filled by the insulating layer 7 (insulating layer 7a) on a main surface S2 side (top side). And external connection electrodes (solder bumps) 8 are provided on the opposite side (bottom side) of this main surface S2 side.

More specifically, the insulating layer 7 is formed on the surface S1 (bottom side) of the semiconductor substrate 1, and the thickness thereof is about 60 μm, for instance. The insulating layer 7 is made of a material that develops plastic flow when pressurized. An example of the material that develops plastic flow when pressurized is epoxy thermosetting resin. The epoxy thermosetting resin to be used for the insulating layer 7 may be, for example, one having a viscosity of 1 kPa·s under the conditions of 160° C. and 8 MPa. If a pressure of 15 MPa is applied to this material at a temperature of 160° C., then the viscosity of the resin will drop to about ⅛ of that before the pressurization. In contrast to this, an epoxy resin in B stage before thermosetting has no viscosity similarly to a case when the resin is not pressurized, and the epoxy resin develops no viscosity even when pressurized.

The rewiring pattern (wiring layer) 4 is formed on the insulating layer 7. The rewiring pattern 4 is provided not only with the bump (projecting conductor portions) 4a integrally therewith, which projects from the main surface S2 and penetrates the insulating layer 7 but also with the groove 4b, which is filled by the insulating layer 7 (insulating layer 7a) on the main surface S2. The rewiring pattern 4 and the bump 4a may be formed using a rolled metal such as rolled copper. Such rolled copper performs excellently as a material for rewiring because it has greater mechanical strength than a copper film formed by plating or the like. The thickness of the rewiring pattern 4 is about 30 μm, for instance, and the height (thickness) of the bump 4a is about 60 μm, for instance. The bump 4a, which may be circular or round-shaped, has a head portion 4a1, whose surface is in parallel with the contact surface of the electrode 2a of the semiconductor substrate 1, and a side portion 4a2, which is formed in such a manner that the diameter is smaller toward the head portion 4a1. The diameters of the head (head portion 4a1) and the bottom plane of the bump 4a are about 40 μmφ and about 60 μmφ, respectively. Also, the bumps 4a are provided in positions corresponding to the electrodes 2a. The head (head portion 4a1) of the bump 4a is formed in such a manner as to directly contact the electrode 2a of the semiconductor substrate 1, thereby coupling the electrode 2a and the rewiring pattern 4 electrically. The depth of the groove 4b provided on the main surface S2 of the rewiring pattern (wiring layer) 4 is, for instance, about 15 μm. The groove 4b is provided near the bump 4a, and extra part of the insulating layer 7, such as the part pushed out by the bump 4a, flows into the groove 4b when a copper sheet 4z, an insulating layer 7 and a circuit element 2 are stacked in such a manner as to embed the bump 4a in the insulating layer 7. Note that a semiconductor substrate 1 is an example of a "semiconductor substrate" of the present embodiment, a circuit element 2 is an example of a "circuit element" thereof, an electrode 2a is an example of an "electrode" thereof, a bump 4a is an example of a "bump" thereof, a groove 4b is an example of a "first groove" thereof, a copper sheet 4z is an example of a "metal sheet" thereof, and an insulating layer 7 is an example of an "insulating layer" thereof.

(Manufacturing Method)

FIGS. 2A to 2D and FIGS. 3A to 3C are cross-sectional views for explaining a method for forming a copper sheet having bumps and grooves. FIG. 4 is a plan view showing a semiconductor wafer with semiconductor substrates, which are demarcated by a plurality of scribe lines, arranged in a matrix shape. FIGS. 5A to 5D and FIGS. 6A to 6C are schematic cross-sectional views for explaining a manufacturing process for a semiconductor module according to the first embodiment shown in FIG. 1. Now, with reference to FIGS. 1 through 6C, a description will be given of a manufacturing process of a semiconductor module according to the first embodiment.

Figure 2A:
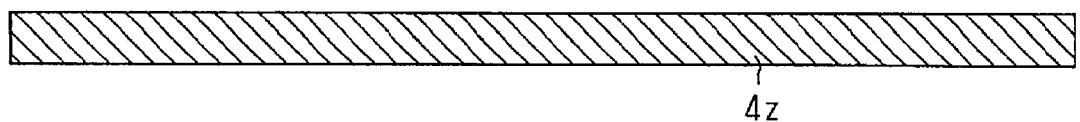
FIGS. 2A to 2D are cross-sectional views for explaining a method for forming a copper sheet having bumps and grooves.

As illustrated in FIG. 2A, a copper sheet 4z having a thickness greater than at least the sum of the height of the bumps (projecting conductor portions) 4a and the thickness of the rewiring pattern (wiring layer) 4 is prepared. The thickness of the copper sheet 4z employed herein is about 300 μm. And the rolled metal used for the copper sheet 4z is a rolled copper.

Figure 2B:
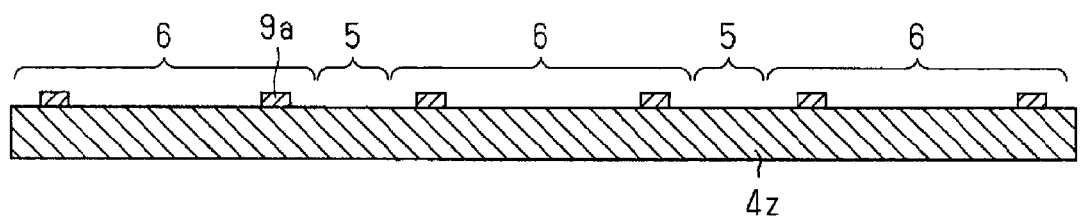

As illustrated in FIG. 2B, a resist mask 9a is formed over a bump forming portion in a semiconductor module forming region 6 by employing an ordinary lithography method. Here, the bump forming portions are so arranged that they correspond to the positions of electrodes 2a on semiconductor substrates 1 in a semiconductor wafer demarcated into a plurality of semiconductor module forming regions 6 by a plurality of scribe lines 5.

Figure 2C:
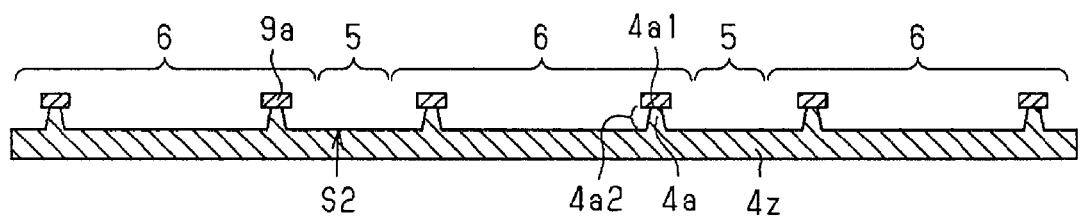

As illustrated in FIG. 2C, an etching is performed using the resist mask 9a as a mask to form a bump 4a in a predetermined pattern such that the bump 4a project from the main surface S2 of the copper sheet 4z. At this time, an etching condition is adjusted so that each bumps 4a is formed with the side portion 4a2 thereof growing smaller in diameter toward the head portion 4a1 thereof. As used herein, the height of the bump 4a is about 60 μm, and the diameters of the head (head portion 4a1) and the bottom plane thereof are about 40 μmφ and about 60 μmφ, respectively. Note also that the copper sheet 4z provided with the bumps 4a is one example of "metal sheet" of the present embodiment.

Figure 2D:
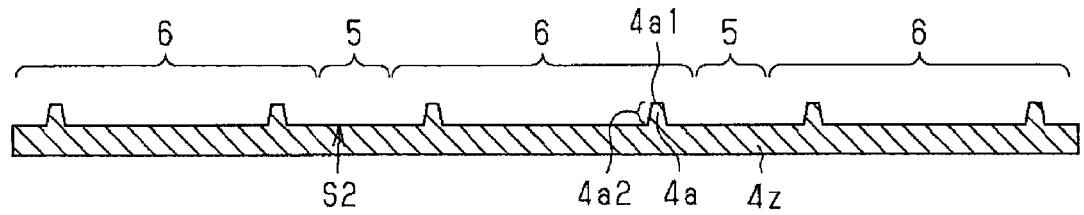

As illustrated in FIG. 2D, the resist mask 9a is removed. As a result, the bump 4a having a head portion 4a1 and a side portion 4a2, which is formed in such a manner that the diameter is smaller toward the head portion 4a1, is formed on the copper sheet 4z. It is to be noted that a metal mask of silver (Ag) may be used instead of the resist mask 9a. In such a case, etch selectivity in relation to the copper sheet 4z can be amply secured, so that finer patterning of the bumps 4a can be realized.

Figure 3A:
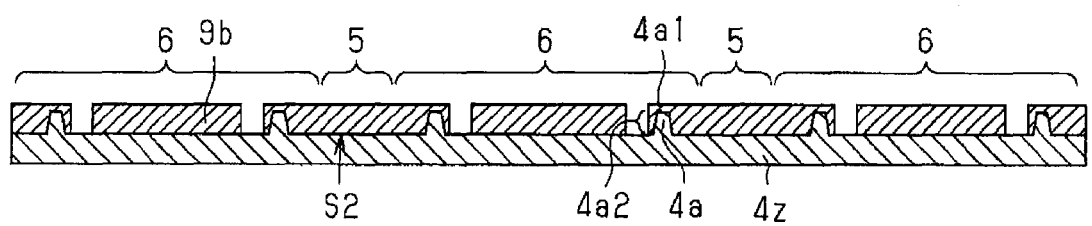
FIGS. 3A to 3C are cross-section views for explaining a method for forming a copper sheet having bumps and grooves.
Figure 4:
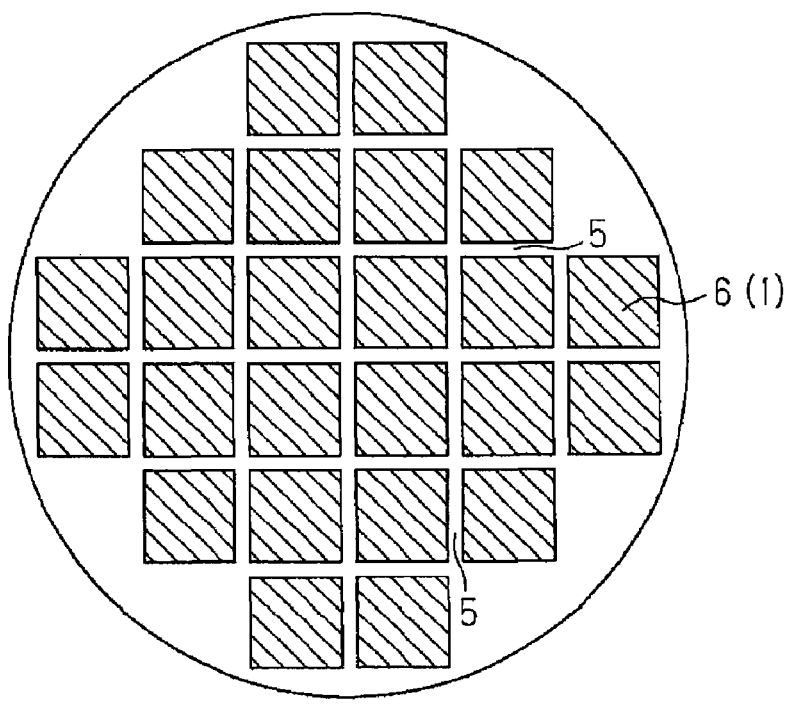
FIG. 4 is a plan view showing a semiconductor wafer with semiconductor substrates, which are demarcated by a plurality of scribe lines, arranged in a matrix shape.

Next, as illustrated in FIG. 3A, a resist mask 9b is formed in the groove forming area in a semiconductor module forming regions 6 by employing the ordinary lithography method.

Figure 3B:
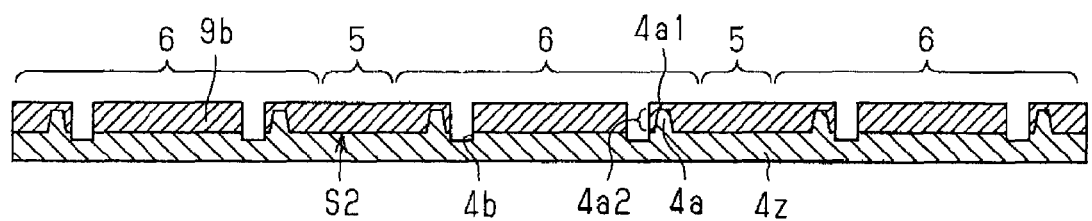

As illustrated in FIG. 3B, an etching is performed using the resist mask 9b as a mask to form grooves 4b in a predetermined pattern such that they are dug from the main surface S2 of the copper sheet 4z. Herein, the groove 4b has a depth of about 15 μm and is located near the bumps 4a.

Figure 3C:
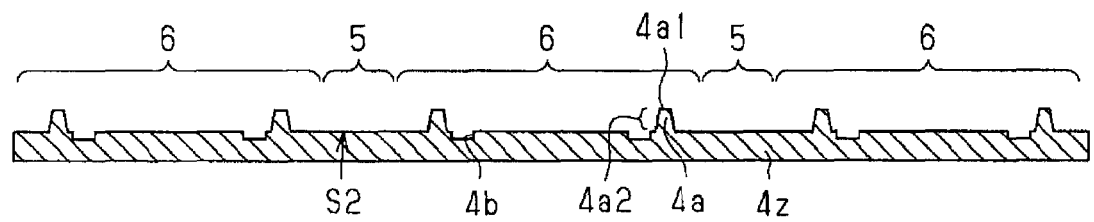

As illustrated in FIG. 3C, the resist mask 9b is removed. As a result, the copper sheet 4z having the bump 4a projecting from the main surface S2 thereof and the groove 4b dug therein is formed.

The copper sheet 4z manufactured as described above is prepared separately, and it is used in a fabrication process of a semiconductor module according to the first embodiment, which will now be described below.

Figure 5A:
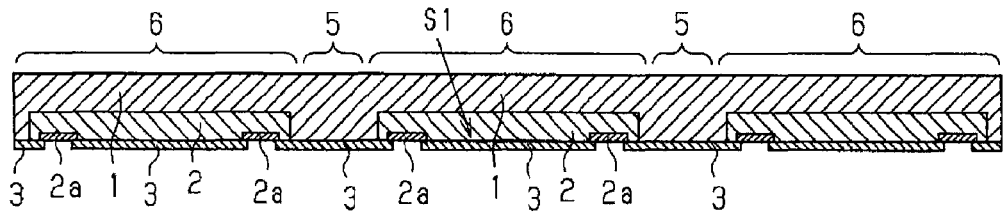
FIGS. 5A to 5D are schematic cross-sectional views for explaining a manufacturing process for a semiconductor module according to a first embodiment of the present invention.

Firstly, as illustrated in FIG. 5A, a semiconductor wafer with semiconductor substrates 1, each including a circuit element 2, electrodes 2a and a protective film 3, formed in a matrix shape on the surface S1 is prepared. Note that the semiconductor wafer, as shown in FIG. 4, is demarcated into a matrix of a plurality of semiconductor module forming regions 6 (semiconductor substrates 1) by a plurality of scribe lines. The semiconductor module forming regions 6 are the regions where circuit devices as described earlier are formed.

More specifically, as illustrated in FIG. 5A, for each of the semiconductor substrates 1, such as a p-type silicon substrate, within a semiconductor wafer, a circuit element 2, such as a predetermined electric circuit, is formed on the surface S1 (bottom side) thereof by a known technology. Also, electrodes 2a are formed in the peripheral or top part of the circuit element 2. The material generally used for the electrodes 2a is aluminum or other metal. The protective film 3 insulating to protect the semiconductor substrate 1 is formed on the area of the surface S1 of the semiconductor substrate 1 except that of the electrodes 2a. As the protective film 3, a silicon dioxide film ($SiO_2$), a silicon nitride film (SiN) or the like is employed.

Figure 5B:
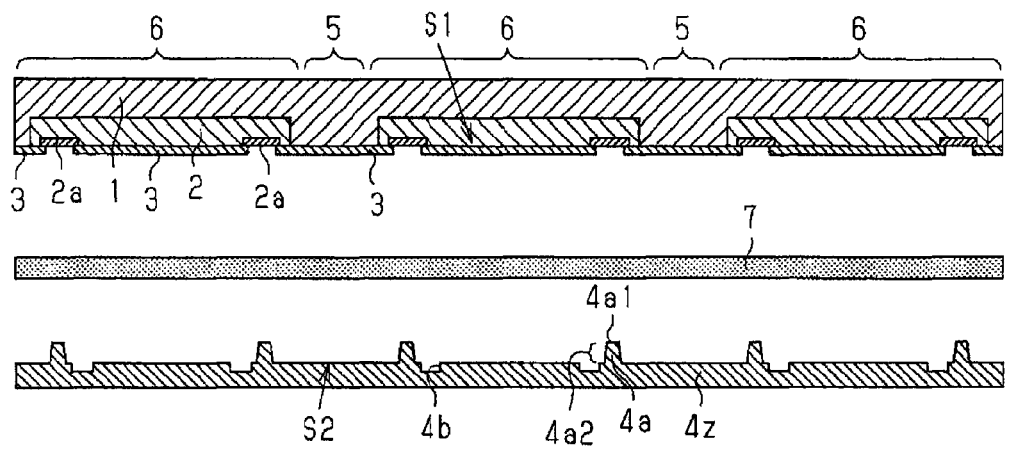

As illustrated in FIG. 5B, at the surface S1 (bottom side) of the semiconductor wafer (semiconductor substrate 1), an insulating layer 7 is held between the semiconductor substrate 1 and the copper sheet 4z which has bumps 4a formed integrally therewith and grooves 4b formed in their vicinity. The thickness of the insulating layer 7 is about 60 μm, or about the same as that of the bumps 4a. Note that the method for forming a copper sheet 4z having the bumps 4a and the grooves 4b is as described earlier.

Figure 5C:
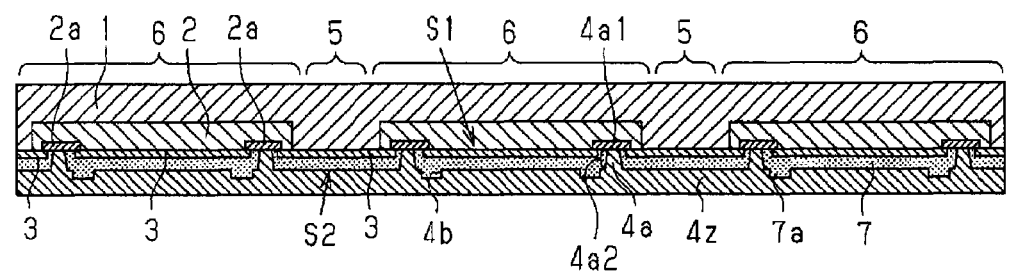

As illustrated in FIG. 5C, the semiconductor substrate 1, the insulating layer 7 and the copper sheet 4z, held together as described above, are now press-formed by a press machine into a single block. The pressure and the temperature for the press-forming are about 5 MPa and 200° C., respectively. The press-forming causes a drop in viscosity of the insulating layer 7, which sets off plastic flow therein. As a result, the bumps 4a penetrate the insulating layer 7, thus electrically coupling the bumps 4a with the electrodes 2a of the semiconductor substrate 1. At the same time, extra material of the insulating layer 7 (insulating layer 7a) pushed out by the bumps 4a flows into the grooves 4b. Also, at this time, the bump 4a, which has a side portion 4a2 formed with increasingly smaller diameter toward the head portion 4a1, penetrates the insulating layer 7 smoothly. All these arrangements make it possible to push insulating layer 7 effectively out of the interface between the bumps 4a and the electrodes 2a of the semiconductor substrate 1, thus making it harder for part of the insulating layer 7 to remain at the interface.

Figure 5D:
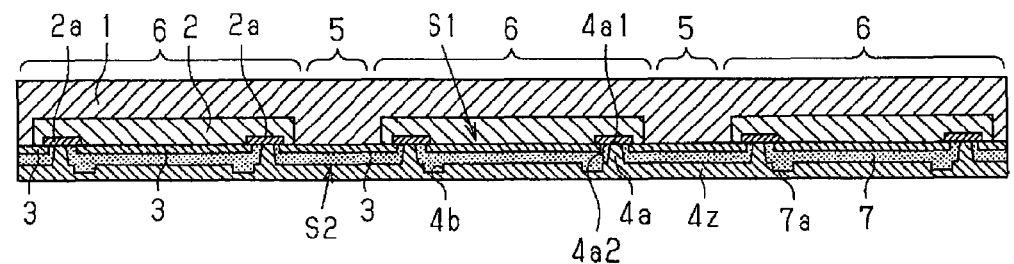

As illustrated in FIG. 5D, the copper sheet 4z is adjusted into the thickness of a rewiring pattern 4 by etching the whole of the copper sheet 4z from the opposite side of the main surface S2. The thickness of the rewiring pattern 4 according to this embodiment is about 30 μm.

Figure 6A:
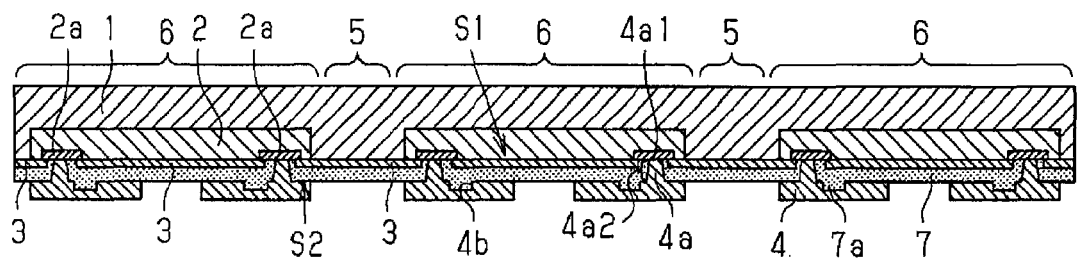
FIGS. 6A to 6C are schematic cross-sectional views for explaining a manufacturing process for a semiconductor module according to a first embodiment shown in FIG. 1.

Next, as illustrated in FIG. 6A, the copper sheet 4z is processed into a rewiring pattern (wiring layer) 4 with a predetermined line/space pattern, using a photolithography and etching technique.

To be more precise, a resist film of about 20 μm in thickness is affixed to the copper sheet 4z, using a laminator, and a UV-exposure is performed using a photomask having a predetermined line/space pattern. Then the resist film in an unexposed regions is removed by a development process using $Na_2CO_3$ solution, so that a resist mask (not shown) is formed selectively on the copper sheet 4z. Note here that it is desirable to perform a preprocessing, such as polishing or cleaning, of the surface of the copper sheet 4z, as need arises, before the lamination of the resist film in order to improve the adhesiveness to the resist mask. Following this, the exposed parts of the copper sheet 4z are etched with a ferric chloride solution to form the rewiring pattern (wiring layer) 4 having a predetermined line/space pattern. After this, the resist mask is removed, using a remover, such as an NaOH solution.

Figure 6B:
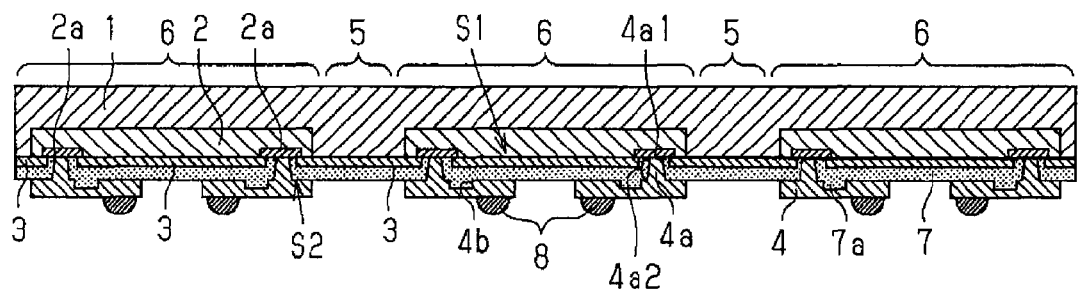

As illustrated in FIG. 6B, external connection electrodes (solder balls) 8, which function as external connection terminals for the parts of rewiring pattern 4 connected to the electrodes 2a via the bumps 4a, are formed by employing a solder printing method. More specifically, the external connection electrodes (solder balls) 8 are formed by printing "soldering paste", which is a pasty mixture of resin and solder material, in desired positions through a screen mask and then heating the printed paste to a solder melting point. As another method, a flux may be applied in advance to the rewiring pattern 4 side, and then solder balls may be mounted on the rewiring pattern 4.

Figure 6C:
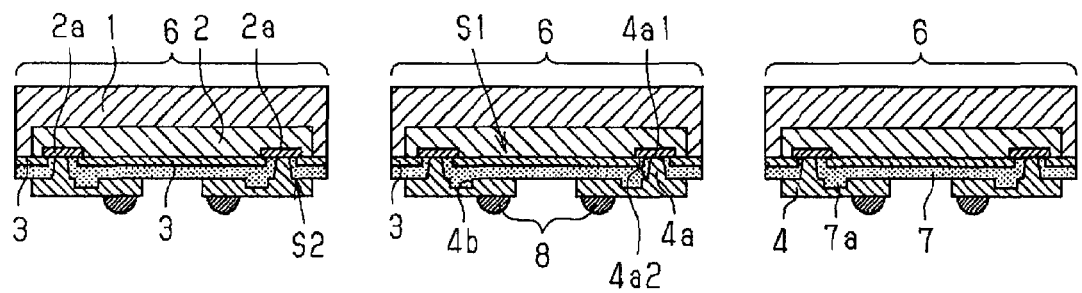

As illustrated in FIG. 6C, a semiconductor wafer is divided into individual semiconductor modules, each having the same outside dimensions as those of the semiconductor substrate 1, by dicing the semiconductor wafer from the back side (top side) thereof along scribe lines 5 demarcating a plurality of semiconductor module forming regions 6. After that, the residues or the like resulting from the dicing are removed by a cleaning processing using a chemical.

Through these processes, a semiconductor module of the first embodiment as shown in FIG. 1 is manufactured.

The following advantageous effects are produced by the above-described manufacturing method of a semiconductor module according to the first embodiment:

(1) A copper sheet 4z having bumps 4a projecting from the main surface S2 and grooves 4b provided in the main surface S2 and a semiconductor substrate 1 are pressure-bonded to each other through the medium of an insulating layer 7. Thereby, extra part of the insulating layer 7, such as one pushed out by the bump 4a, flows into the groove 4b. As a result, the probability that the residual film of insulating layer 7 will remain at the interface between the bumps 4a and the electrodes 2a of the semiconductor substrates 1 is suppressed. Thus, it is possible to easily manufacture semiconductor modules characterized by improved connection reliability between the bumps 4a and the electrodes 2a.

(2) The grooves 4b, which are provided in the copper sheet 4z together with the bumps 4a, function as room for part of the insulating layer 7 pushed out by the bumps 4a to escape into, especially near the center of the semiconductor wafer. Therefore, it is possible to manufacture reproducibly and stably semiconductor modules featuring enhanced connection reliability between the bumps 4a and the electrodes 2a over the whole area of a semiconductor wafer. As a result, the production cost of the semiconductor module can be reduced.

(3) Rewiring patterns (wiring layers) 4, each having bumps 4a and grooves 4b, are formed all together in the state of a semiconductor wafer before it is divided into individual semiconductor modules. Therefore, the production cost of the semiconductor module can be made lower than when the rewiring pattern 4 is formed individually for each semiconductor module.

Second Embodiment

Figure 7:
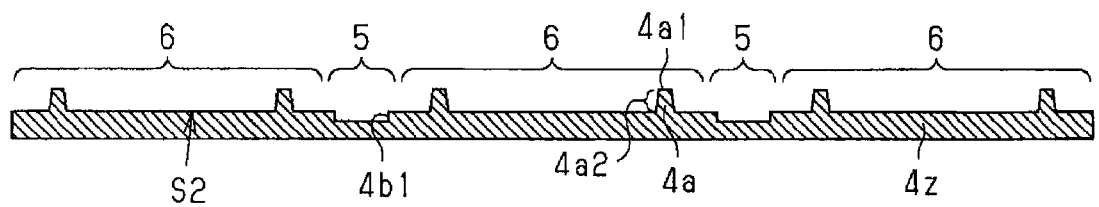
FIG. 7 is a cross-sectional view explaining a copper sheet having bumps and grooves according to a second embodiment of the present invention.

FIG. 7 is a cross-sectional view for explaining a copper sheet having bumps and grooves according to a second embodiment of the present invention. FIGS. 8A to 8C and FIGS. 9A to 9C are schematic cross-sectional views for explaining a manufacturing process for a semiconductor module according to the second embodiment. Now, with reference to FIGS. 7 through 9C, a description will be given of a manufacturing process of a semiconductor module according to the second embodiment.

As illustrated in FIG. 7, a difference from the copper sheet having bumps and grooves according to the first embodiment lies in that grooves 4b1 are formed within the scribe lines 5 instead of within the semiconductor module forming regions 6. Note that these grooves 4b1 are formed in a matrix in such a manner that they surround the semiconductor module forming regions 6 (semiconductor substrates 1) along the scribe lines 5. A copper sheet 4z having such grooves 4b1 may be manufactured easily by changing the mask pattern of the resist mask 9b as shown in FIG. 3A. Otherwise, the manufacturing method of the copper sheet 4z is the same as that for the copper sheet 4z explained in the first embodiment. Note that scribe lines 5 are an example of "scribe regions" of the present embodiment.

A copper sheet 4z manufactured as described above is prepared separated, and it is used in a manufacturing process of a semiconductor module according to the second embodiment, which will now be described below.

Figure 8A:
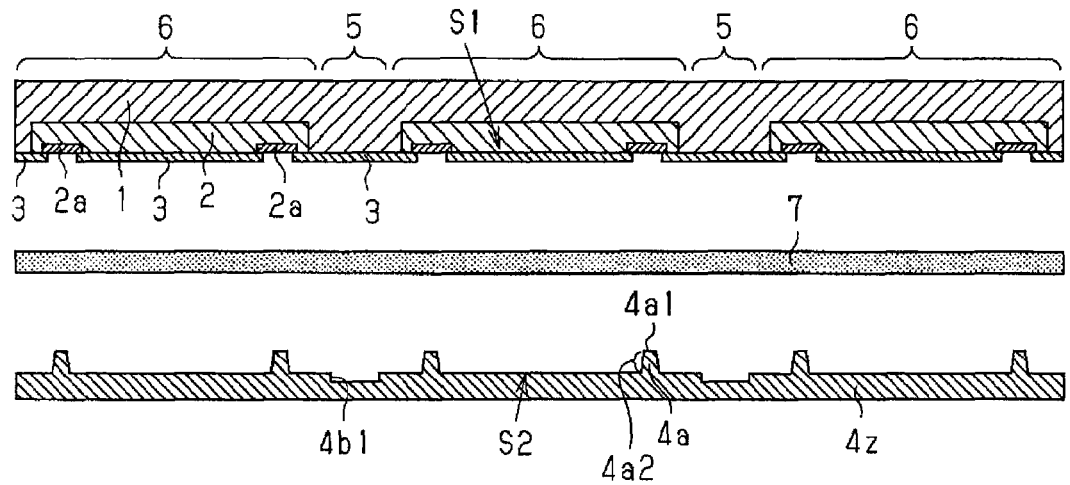
FIGS. 8A to 8C are schematic cross-sectional views for explaining a manufacturing process for a semiconductor module according to a second embodiment of the present invention.

Firstly, as illustrated in FIG. 8A, at the surface S1 (bottom side) of the semiconductor wafer (semiconductor substrate 1), an insulating layer 7 is held between the semiconductor substrate 1 and the copper sheet 4z which has bumps 4a formed integrally therewith and grooves 4b1 formed in the scribe lines 5. The common parts such as the insulating layer 7 and the copper sheet 4z are the same as those of the first embodiment.

Figure 8B:
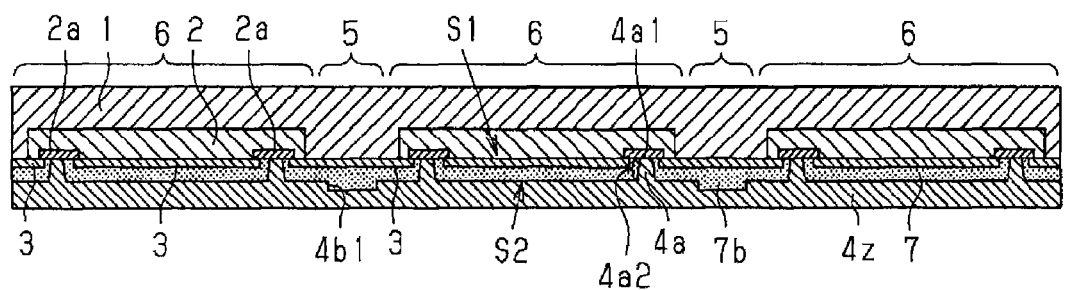

As illustrated in FIG. 8B, the semiconductor substrate 1, the insulating layer 7 and the copper sheet 4z, held together as described above, are now press-formed by a press machine into a single block. The press-forming conditions to be employed are the same as those of the first embodiment.

The press-forming causes a drop in viscosity of the insulating layer 7, which sets off plastic flow therein. As a result, the bumps 4a penetrate the insulating layer 7, thus electrically coupling the bumps 4a with the electrodes 2a of the semiconductor substrate 1. At the same time, extra material of the insulating layer 7 (insulating layer 7b) pushed out by the bumps 4a flows into the grooves 4b1 provided in the scribe lines 5. And all these make it possible to push insulating layer 7 effectively out of the interface between the bumps 4a and the electrodes 2a of the semiconductor substrate 1, thus making it harder for part of the insulating layer 7 to remain at the interface.

Figure 8C:
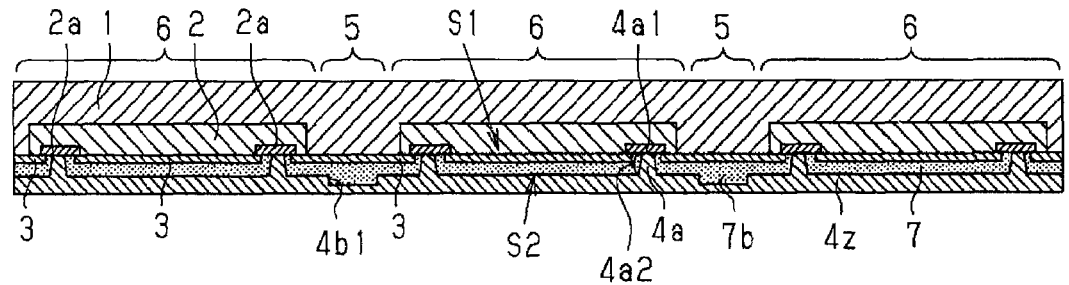

As illustrated in FIG. 8C, the copper sheet 4z is adjusted into the thickness of a rewiring pattern 4 by etching the whole of the copper sheet 4z from the opposite side of the main surface S2. The thickness of the rewiring pattern 4 according to this second embodiment is about 30 μm.

Figure 9A:
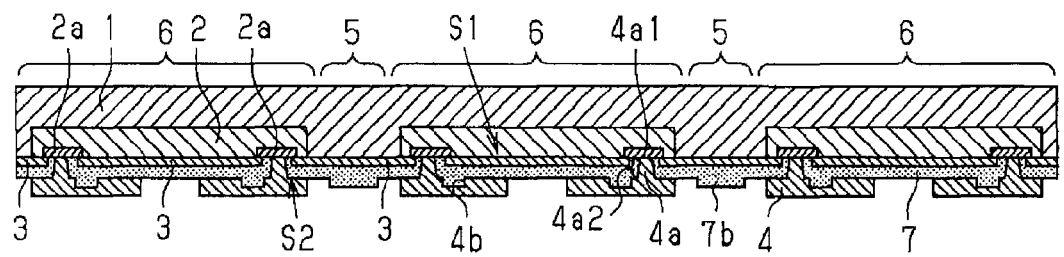
FIGS. 9A to 9C are schematic cross-sectional views for explaining a manufacturing process for a semiconductor module according to a second embodiment of the present invention.

Next, as illustrated in FIG. 9A, the copper sheet 4z is processed into a rewiring pattern (wiring layer) 4 with a predetermined line/space pattern, using a photolithography and etching process. At this time, an insulating layer 7b is formed in a raised manner within the scribe lines 5. The insulating layer 7b, reflecting the shape of the groove 4b1 exactly, have a height of about 15 μm.

Figure 9B:
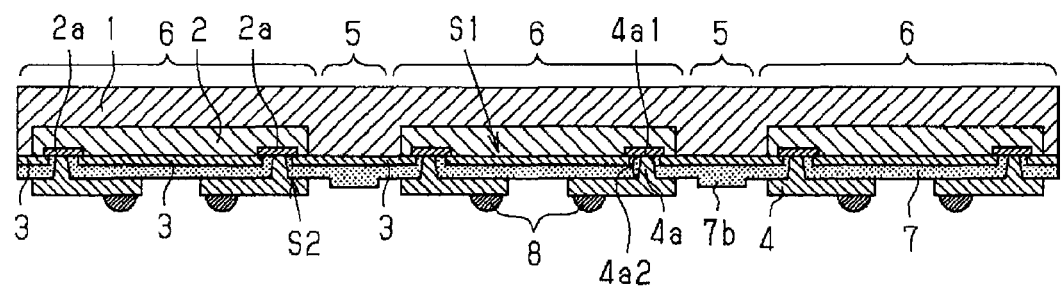

As illustrated in FIG. 9B, external connection electrodes (solder balls) 8, which function as external connection terminals for the parts of rewiring pattern 4 connected to the electrodes 2a via the bumps 4a, are formed by a solder printing process.

Figure 9C:
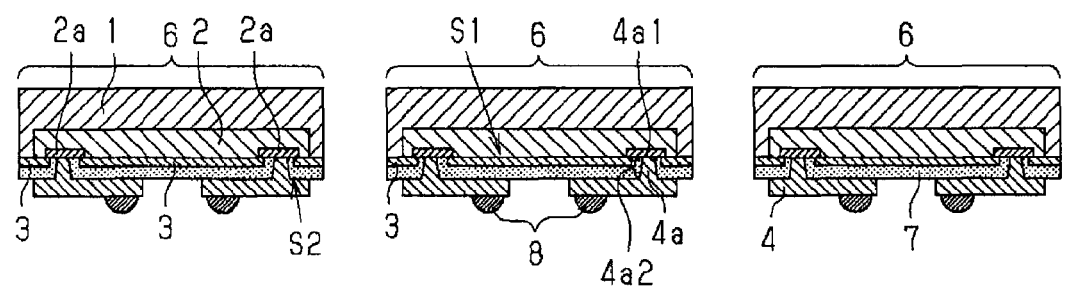

As illustrated in FIG. 9C, a semiconductor wafer is divided into individual semiconductor modules, each having the same outside dimensions as those of the semiconductor substrate 1, by dicing the semiconductor wafer from the back side (top side) thereof along the scribe lines 5 demarcating a plurality of semiconductor module forming regions 6. At this time, the raised insulating layers 7b provided within the scribe lines 5 are removed, so that the grooves 4b1 and the insulating layers 7b no longer exist on the rewiring pattern (wiring layer) 4 of the individual semiconductor modules in the final form.

Through these processes, a semiconductor module of the second embodiment is manufactured.

The following advantageous effects, in addition to those cited in (1) to (3) in the description of the first embodiment, are produced by the manufacturing method of a semiconductor module according to the second embodiment:

(4) The scribe lines 5 are typically a lattice-like region enclosing a plurality of circuit elements formed vertically and horizontally on the surface of a semiconductor wafer (semiconductor substrate 1) in such a manner as to demarcate them into individual circuit elements 2. And they are the region that will be removed as a result of dicing of the semiconductor wafer (semiconductor substrate 1) into individual modules. Hence, it is possible to provide grooves 4b1 in the scribe lines without giving consideration to the layout of the electrodes 2a of the semiconductor substrate 1 (circuit element 2), the rewiring pattern 4 connected thereto and the like. Moreover, a common type of grooves 4b1 may be used in the manufacture of different kinds of circuit elements. Accordingly, semiconductor modules with improved connection reliability can be produced at lower cost.

(5) The electrodes 2a of the semiconductor substrate 1 (circuit element 2) are formed in the peripheral part (near the scribe lines 5) keeping away from the region where an integrated circuit is formed, and the grooves 4b1 are formed within the scribe lines 5. This arrangement makes it easier for extra part of the insulating layer 7, such as one pushed out by the bumps 4a, to flow into the grooves 4b1. As a result, the possibilities that the residual film of insulating layer 7 will remain at the interface between the bumps 4a and the electrodes 2a is further effectively suppressed.

Third Embodiment

Figure 10:
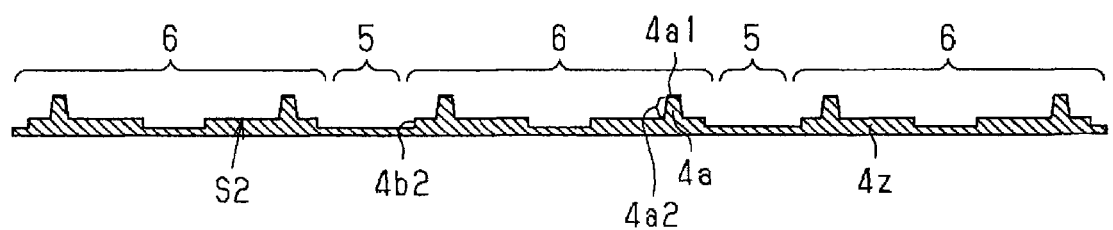
FIG. 10 is a cross-sectional view for explaining a copper sheet having bumps and grooves according to a third embodiment of the present invention.

FIG. 10 is a cross-sectional view for explaining a copper sheet having bumps and grooves according to a third embodiment of the present invention. FIGS. 11A to 11C and FIGS. 12A and 12B are schematic cross-sectional views for explaining a manufacturing process for a semiconductor module according to the third embodiment. Now, with reference to FIGS. 10A through 12B, a description will be given of a manufacturing process of a semiconductor module according to the third embodiment.

As illustrated in FIG. 10, a difference from the copper sheet having bumps and grooves according to the first embodiment lies in that grooves 4b2 are formed in a shape corresponding to the space pattern of rewiring pattern (wiring layer) 4. Note that the depth of the groove 4b2 is about 30 μm, or the same as the height of the rewiring pattern (wiring layer) 4. A copper sheet 4z having such grooves 4b2 may be manufactured easily by changing the mask pattern of a resist mask 9b as shown in FIG. 3A and also controlling the etching conditions as shown in FIG. 3B. Otherwise, the manufacturing method of the copper sheet 4z is the same as that for the copper sheet 4z explained in the first embodiment.

A copper sheet 4z manufactured as described above is prepared separately, and it is used in a manufacturing process of a semiconductor module according to the third embodiment, which will now be described below.

Figure 11A:
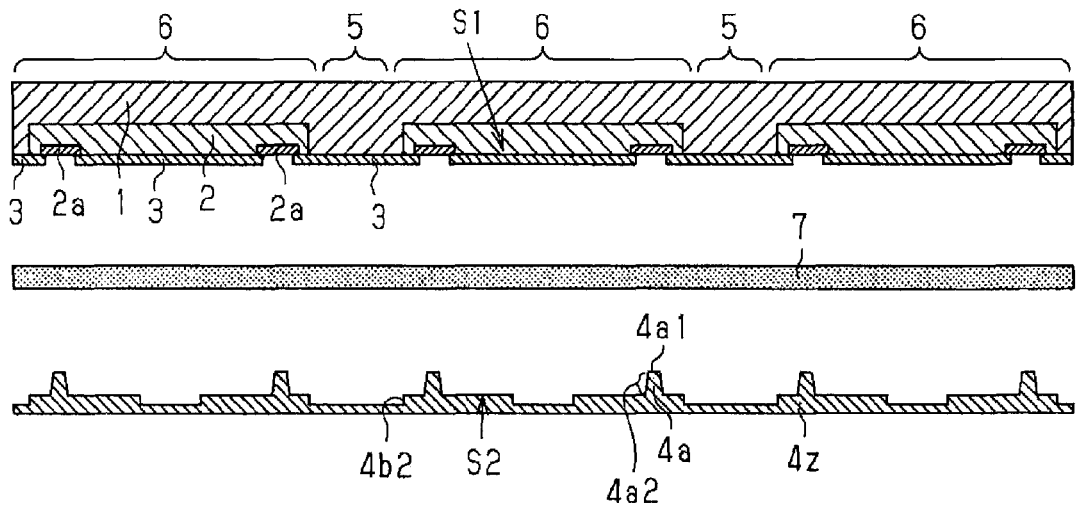
FIGS. 11A to 11C are schematic cross-sectional views for explaining a manufacturing process for a semiconductor module according to a third embodiment of the present invention.

Firstly, as illustrated in FIG. 11A, at the surface S1 (bottom side) of the semiconductor wafer (semiconductor substrate 1), an insulating layer 7 is held between the semiconductor substrate 1 and the copper sheet 4z which has bumps 4a and grooves 4b2. The common parts such as the insulating layer 7 and the copper sheet 4z are the same as those of the first embodiment.

Figure 11B:
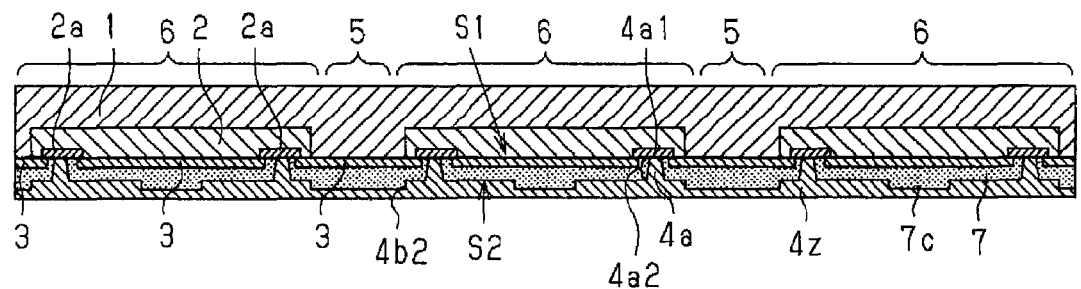

As illustrated in FIG. 11B, the semiconductor substrate 1, the insulating layer 7, and the copper sheet 4z, held together as described above, are press-formed by a press machine into a single block. The press-forming conditions to be employed are the same as those of the first embodiment.

The press-forming causes a drop in viscosity of the insulating layer 7, which sets off plastic flow therein. As a result, the bumps 4a penetrate the insulating layer 7, thus electrically coupling the bumps 4a with the electrodes 2a of the semiconductor substrate 1. At the same time, extra material of the insulating layer 7 (insulating layer 7c) pushed out by the bumps 4a flows into the grooves 4b2. And all these make it possible to push insulating layer 7 effectively out of the interface between the bumps 4a and the electrodes 2a of the semiconductor substrate 1, thus making it harder for part of the insulating layer 7 to remain at the interface.

Figure 11C:
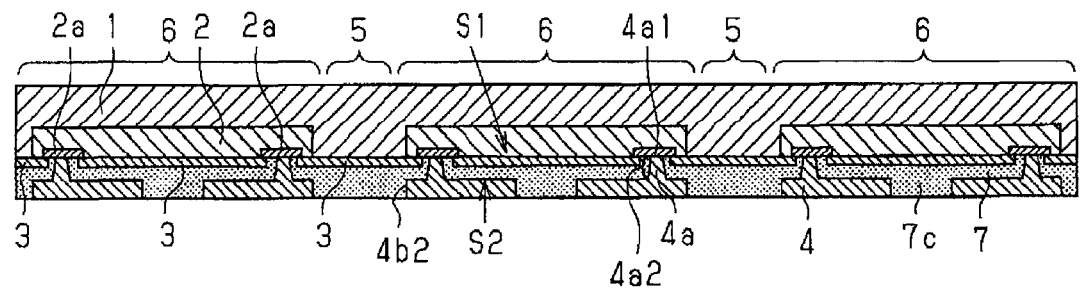

As illustrated in FIG. 11C, the whole of the copper sheet 4z is etched from the opposite side of the main surface S2 until the insulating layer 7c (insulating layer 7) is exposed. As a result, the copper sheet 4z is self-alignedly formed into a rewiring pattern (wiring layer) 4 having a predetermined line/space pattern. At the same time, the bottom side of the rewiring pattern 4 is brought into a planarized state by the insulating layer 7 (insulating layer 7c).

Figure 12A:
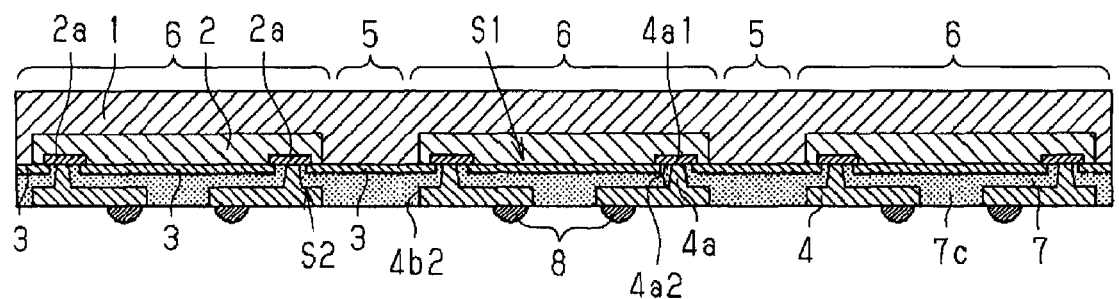
FIGS. 12A and 12B are schematic cross-sectional views for explaining a manufacturing process for a semiconductor module according to a third embodiment of the present invention.

Next, as illustrated in FIG. 12A, external connection electrodes (solder balls) 8, which function as external connection terminals for the parts of rewiring pattern 4 connected to the electrodes 2a via the bumps 4a, are formed by a solder printing process.

Figure 12B:
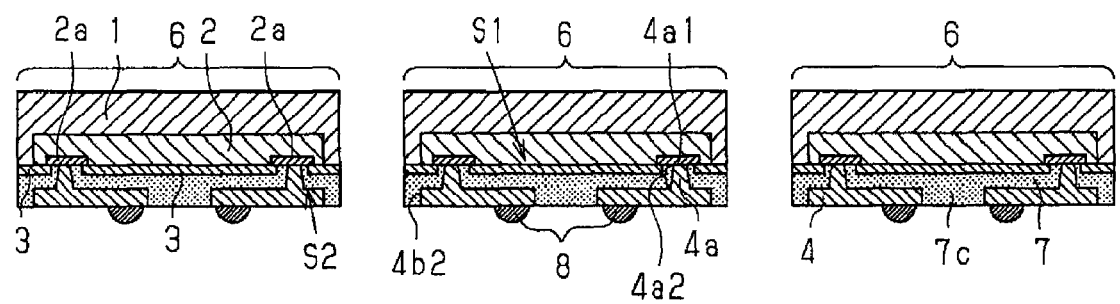

As illustrated in FIG. 12B, a semiconductor wafer is divided into individual semiconductor modules, each having the same outside dimensions as those of the semiconductor substrate 1, by dicing the semiconductor wafer from the back side (top side) thereof along the scribe lines 5 demarcating a plurality of semiconductor module forming regions 6.

Through these processes, a semiconductor module of the third embodiment is manufactured.

The following advantageous effect, in addition to those cited in (1) to (3) in the description of the first embodiment, is produced by the manufacturing method of a semiconductor module according to the third embodiment:

(6) A rewiring pattern (wiring layer) 4 having a predetermined line/space pattern is formed self-alignedly according to the space pattern of the grooves 4b2, so that there is no need for the lithography and etching process to form the rewiring pattern 4 by processing the copper sheet 4z. As a result, semiconductor modules characterized by improved connection reliability between the bumps 4a and the electrodes 2a can be produced at lower cost.

Fourth Embodiment

Figure 13:
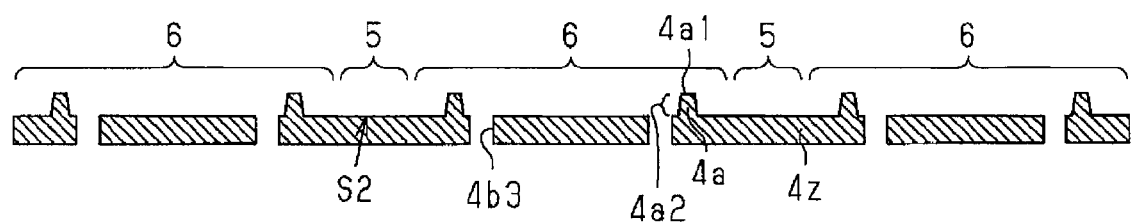
FIG. 13 is a cross-sectional view for explaining a copper sheet having bumps and through-holes according to a fourth embodiment of the present invention.

FIG. 13 is a cross-sectional view for explaining a copper sheet having bumps and through-holes according to a fourth embodiment of the present invention. FIGS. 14A to 14C and FIGS. 15A to 15C are schematic cross-sectional views for explaining a manufacturing process for a semiconductor module according to the fourth embodiment. Now, with reference to FIGS. 13 through 15C, a description will be given of a manufacturing process of a semiconductor module according to the fourth embodiment.

As illustrated in FIG. 13, a difference from the copper sheet having bumps and grooves according to the first embodiment lies in that the grooves are penetrating grooves 4b3 which are formed such that the bottom of the grooves reaches the back side of the copper sheet $4z$. The present embodiment includes such penetrating grooves $4b3$ among the grooves as used herein. Note also that the layout of the penetrating grooves $4b3$ is the same as that of the grooves $4b$ of the first embodiment. A copper sheet $4z$ having such penetrating grooves $4b3$ can be manufactured easily by changing the mask pattern of a resist mask $9b$ as shown in FIG. 3A and also controlling the etching conditions as shown in FIG. 3B. Otherwise, the manufacturing method of the copper sheet $4z$ is the same as that for the copper sheet $4z$ explained in the first embodiment.

A copper sheet $4z$ manufactured as described above is prepared separately, and it is used in a manufacturing process of a semiconductor module according to the fourth embodiment, which will now be described below.

Figure 14A:
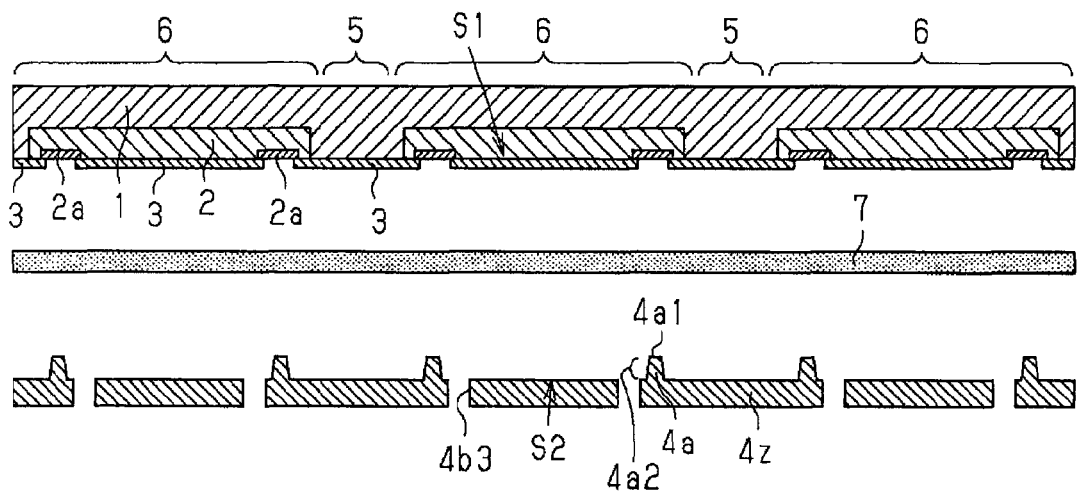
FIGS. 14A to 14C are schematic cross-sectional views for explaining a manufacturing process for a semiconductor module according to a fourth embodiment of the present invention.

Firstly, as illustrated in FIG. 14A, at the surface S1 (bottom side) of the semiconductor wafer (semiconductor substrate 1), an insulating layer 7 is held between the semiconductor substrate 1 and a copper sheet $4z$ which has bumps $4a$ and penetrating grooves $4b3$. The common parts such as the insulating layer 7 and the copper sheet $4z$ are the same as those of the first embodiment.

Figure 14B:
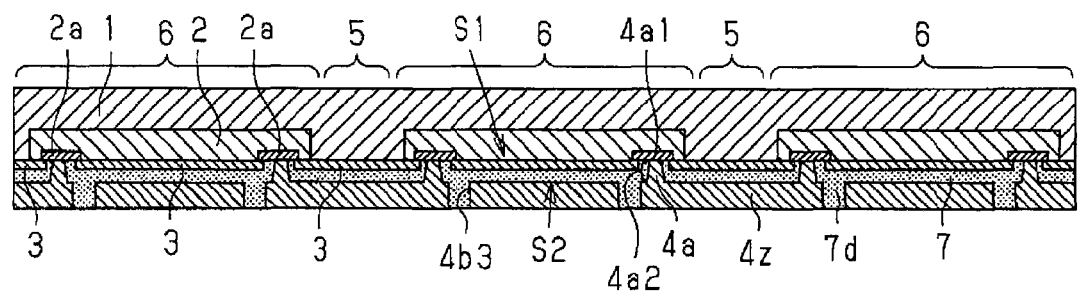

As illustrated in FIG. 14B, the semiconductor substrate 1, the insulating layer 7 and the copper sheet $4z$, held together as described above, are press-formed by a press machine into a single block. The press-forming conditions to be employed are the same as those of the first embodiment.

The press-forming causes a drop in viscosity of the insulating layer 7, which sets off plastic flow therein. As a result, the bumps $4a$ penetrate the insulating layer 7, thus electrically coupling the bumps $4a$ with the electrodes $2a$ of the semiconductor substrate 1. At the same time, extra material of the insulating layer 7 (insulating layer $7d$) pushed out by the bumps $4a$ flows into the penetrating grooves $4b3$. If there is even more of extra insulating layer 7, it can be easily removed by leading it through the penetrating grooves $4b3$ and out to the back side of the copper sheet $4z$. This makes it possible to push insulating layer 7 effectively out of the interface between the bumps $4a$ and the electrodes $2a$ of the semiconductor substrate 1, thus making it harder for part of the insulating layer 7 to remain at the interface.

Figure 14C:
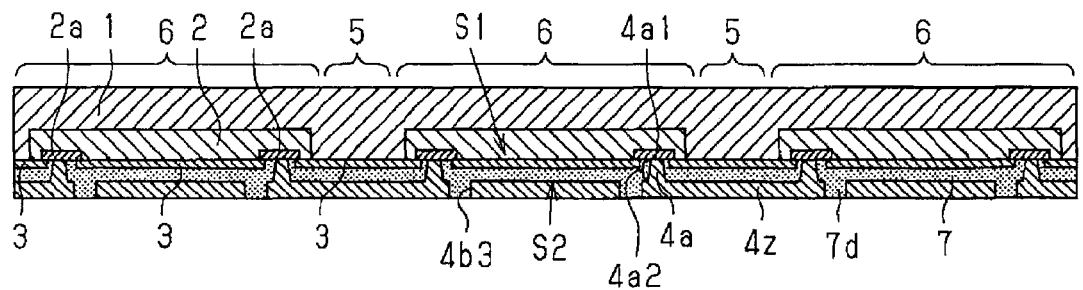

As illustrated in FIG. 14C, the copper sheet $4z$ is adjusted into the thickness of a rewiring pattern 4 by etching the copper sheet $4z$ and the insulating layer $7d$ from the opposite side of the main surface S2. The thickness of the rewiring pattern 4 according to this fourth embodiment is about 30 μm.

Figure 15A:
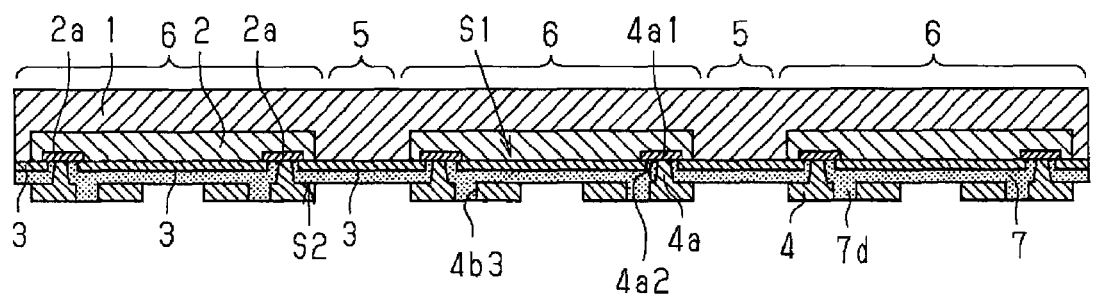
FIGS. 15A to 15C are schematic cross-sectional views for explaining a manufacturing process for a semiconductor module according to a fourth embodiment of the present invention.

Next, as illustrated in FIG. 15A, the copper sheet $4z$ is processed into a rewiring pattern (wiring layer) 4 with a predetermined line/space pattern, using a photolithography and etching process.

Figure 15B:
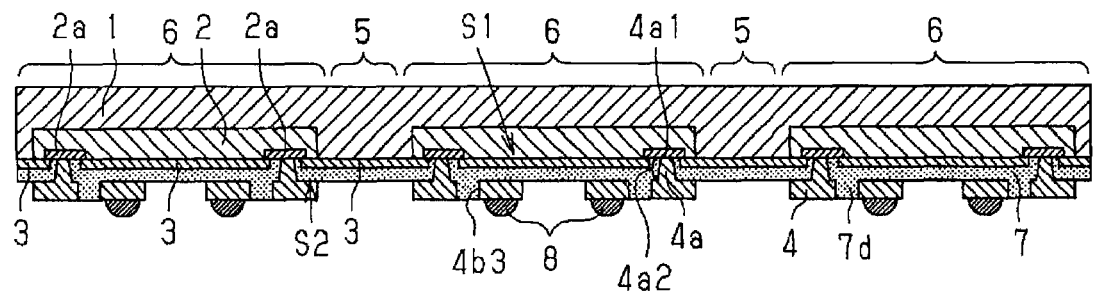

As illustrated in FIG. 15B, external connection electrodes (solder balls) 8, which function as external connection terminals for the parts of rewiring pattern 4 connected to the electrodes $2a$ via the bumps $4a$, are formed by a solder printing process.

Figure 15C:
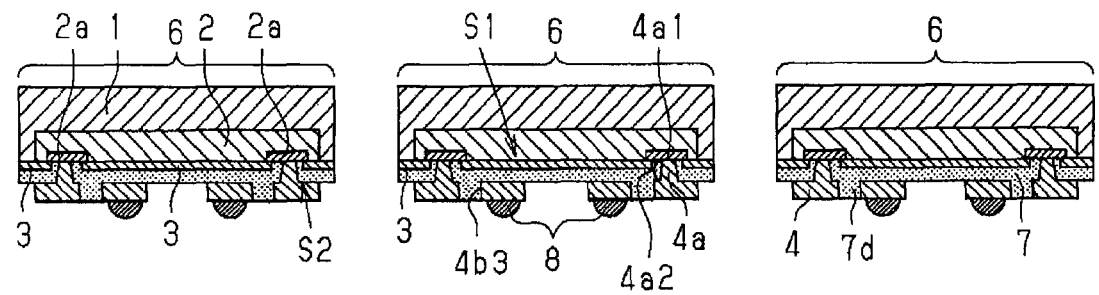

As illustrated in FIG. 15C, a semiconductor wafer is divided into individual semiconductor modules, each having the same outside dimensions as those of the semiconductor substrate 1, by dicing the semiconductor wafer from the back side (top side) thereof along the scribe lines demarcating a plurality of semiconductor module forming regions 6.

Through these processes, a semiconductor module of the fourth embodiment is manufactured.

The following advantageous effects, in addition to those cited in (1) to (3) in the description of the first embodiment, are produced by the manufacturing method of a semiconductor module according to the fourth embodiment:

(7) Extra part of the insulating layer 7, such as one pushed out by the bumps $4a$, not only flows into the penetrating grooves $4b3$, but also flows out to the back side of the copper sheet $4z$ through the penetrating grooves $4b3$ which penetrate the copper sheet $4z$. As a result, the possibility that the residual film of insulating layer 7 will remain at the interface between the bumps $4a$ and the electrodes $2a$ is further effectively suppressed. Thus, it is possible to easily manufacture semiconductor modules characterized by improved connection reliability between the bumps $4a$ and the electrodes $2a$.

(8) The penetrating grooves $4b3$ penetrating the copper sheet $4z$ are provided, so that extra part of the insulating layer 7, such as one pushed out by the bumps $4a$, can be led out to the back side of the copper sheet $4z$ through the penetrating grooves $4b3$. Therefore, it is possible to manufacture semiconductor modules featuring better connection reliability between the bumps $4a$ and the electrodes $2a$ with better reproducibility and stability than when nonpenetrating grooves are provided. As a result, the production cost of the semiconductor module can be reduced.

Fifth Embodiment

FIGS. 16A to 16D and FIGS. 17A to 17C are schematic cross-sectional views for explaining a manufacturing process for a semiconductor module according to a fifth embodiment of the present invention. Now, with reference to FIGS. 16A to 16D and 17A to 17C, a description will be given of a manufacturing process of a semiconductor module according to the fifth embodiment.

A difference from the second embodiment lies in that the grooves $4b1$ formed within the scribe lines 5 on the copper sheet $4z$ side are replaced by the grooves $1a$ formed within the scribe lines 5 on the semiconductor wafer (semiconductor substrate 1) side. Otherwise, the manufacturing method is the same as that for the semiconductor module explained in the second embodiment.

Figure 16A:
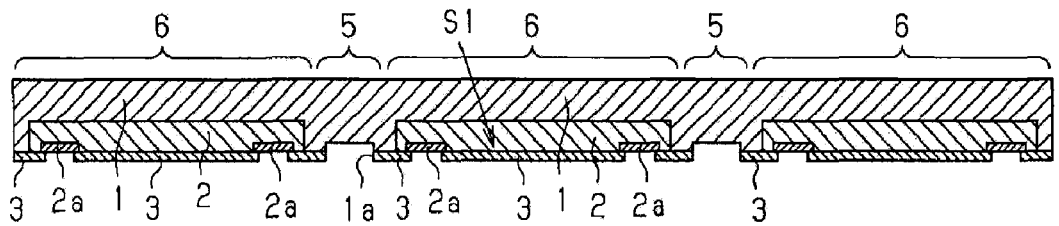
FIGS. 16A to 16D are schematic cross-sectional views for explaining a manufacturing process for a semiconductor module according to a fifth embodiment of the present invention.

Firstly, as illustrated in FIG. 16A, a semiconductor wafer with semiconductor substrates 1 formed in a matrix shape thereon, each semiconductor substrate 1 having electrodes $2a$ and protective film 3 at the surface S1 and grooves $1a$ within scribe lines 5, is prepared separately. Note that such grooves $1a$ may be easily formed by performing an etching process on the semiconductor wafer (semiconductor substrate 1) as shown in FIG. 5A after placing a resist mask corresponding to the groove forming region. Also, they may be easily formed by half-dicing.

Figure 16B:
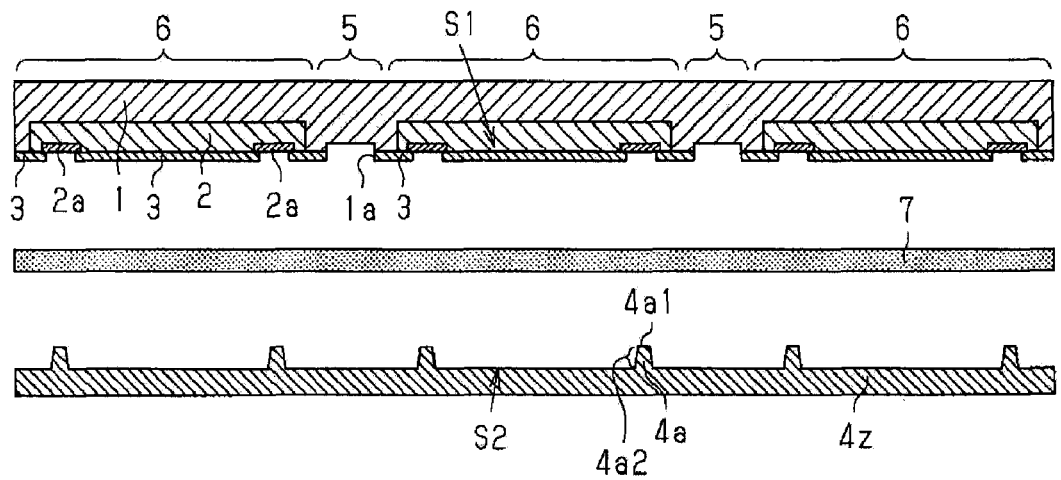

As illustrated in FIG. 16B, at the surface S1 (bottom side) of the semiconductor wafer (semiconductor substrate 1), an insulating layer 7 is held between the semiconductor substrate 1 having grooves $1a$ within the scribe lines 5 and a copper sheet $4z$ having bumps $4a$ formed integrally therewith. The common parts such as the semiconductor substrate 1, the insulating layer 7 and the copper sheet $4z$ are the same as those of the first embodiment.

Figure 16C:
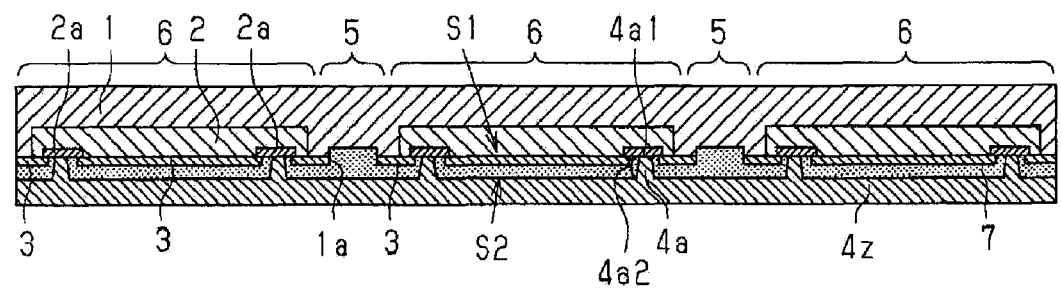

As illustrated in FIG. 16C, the semiconductor substrate 1, the insulating layer 7 and the copper sheet $4z$, held together as described above, are now press-formed by a press machine into a single block. The press-forming conditions to be employed are the same as those of the second embodiment.

The press-forming causes a drop in viscosity of the insulating layer 7, which sets off plastic flow therein. As a result, the bumps $4a$ penetrate the insulating layer 7, thus electrically coupling the bumps $4a$ with the electrodes $2a$ of the semiconductor substrate 1. At the same time, extra material of the insulating layer 7 (insulating layer $7b$) pushed out by the bumps $4a$ flows into the grooves $1a$ provided in the scribe lines 5. All these make it possible to push insulating layer 7 effectively out of the interface between the bumps 4a and the electrodes 2a of the semiconductor substrate 1, thus making it harder for part of the insulating layer 7 to remain at the interface.

Figure 16D:
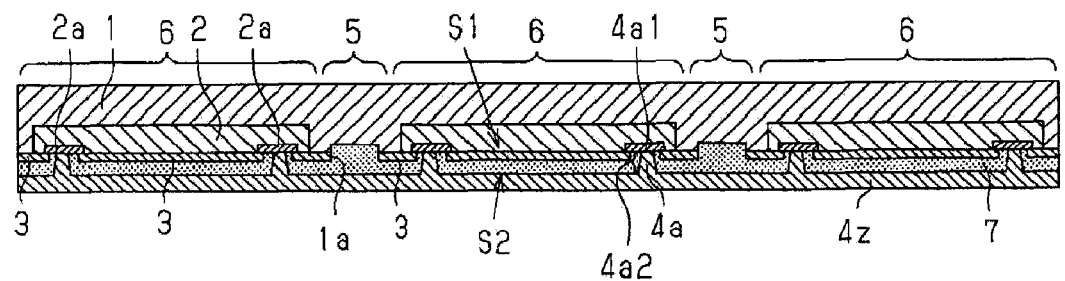

As illustrated in FIG. 16D, the copper sheet 4z is adjusted into the thickness of a rewiring pattern 4 by etching the whole of the copper sheet 4z from the opposite side of the main surface S2.

Figure 17A:
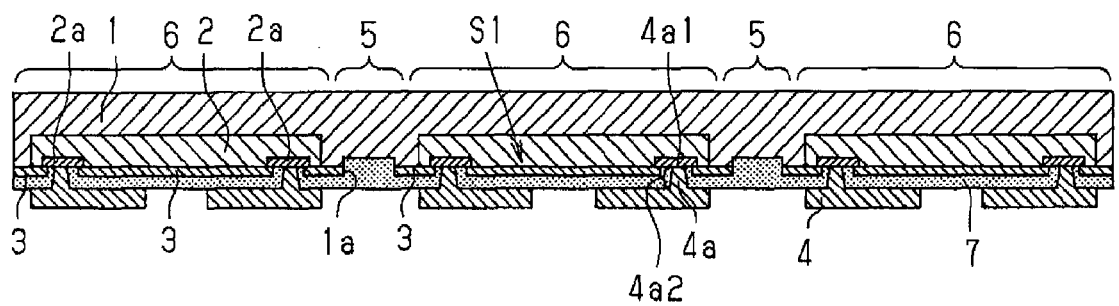
FIGS. 17A to 17C are schematic cross-sectional views for explaining a manufacturing process for a semiconductor module according to a fifth embodiment of the present invention.

Next, as illustrated in FIG. 17A, the copper sheet 4z is processed into a rewiring pattern (wiring layer) 4 with a predetermined line/space pattern, using a photolithography and etching process.

Figure 17B:
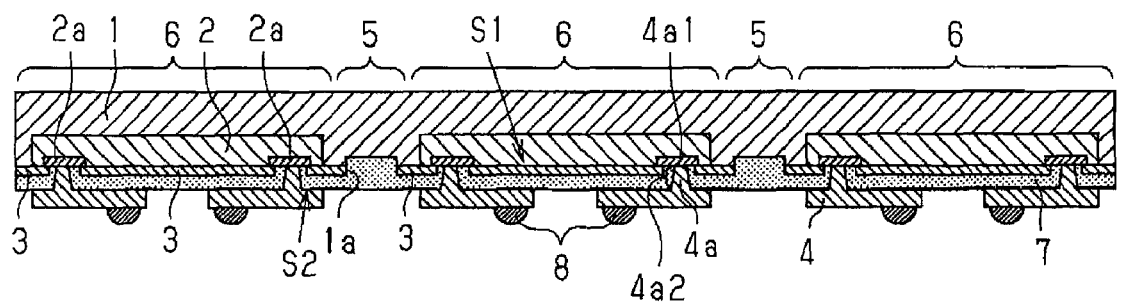

As illustrated in FIG. 17B, external connection electrodes (solder balls) 8, which function as external connection terminals for the parts of rewiring pattern 4 connected to the electrodes 2a via the bumps 4a, are formed by a solder printing process.

Figure 17C:
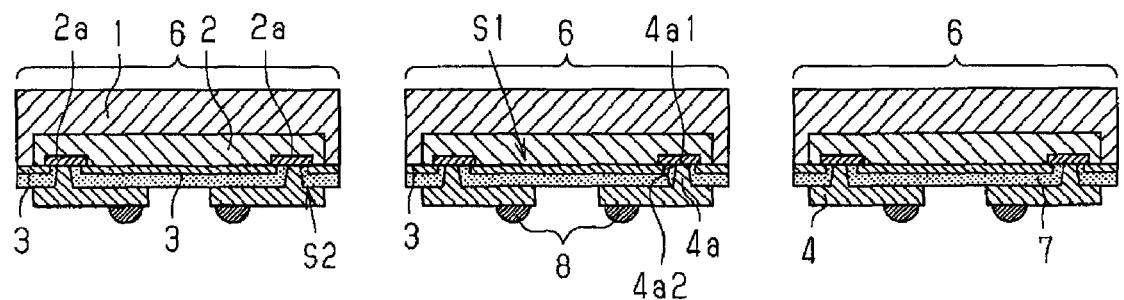

As illustrated in FIG. 17C, a semiconductor wafer is divided into individual semiconductor modules, each having the same outside dimensions as those of the semiconductor substrate 1, by dicing the semiconductor wafer from the back side (top side) thereof along the scribe lines 5 demarcating a plurality of semiconductor module forming regions 6. In so doing, the grooves 1a provided within the scribe lines 5 are removed, so that the grooves 1a no longer exist on the rewiring pattern (wiring layer) 4 of the individual semiconductor modules in the final form.

Through these processes, a semiconductor module of the fifth embodiment is manufactured.

The manufacturing method of a semiconductor module according to the fifth embodiment presents the same advantageous effects as those cited in (1) to (3) of the first embodiment and (4) and (5) of the second embodiment.

Sixth Embodiment

FIGS. 18A to 18D and FIGS. 19A to 19C are schematic cross-sectional views for explaining a manufacturing process for a semiconductor module according to a sixth embodiment of the present invention. Now, with reference to FIGS. 18 and 19, a description will be given of a manufacturing process of a semiconductor module according to the sixth embodiment.

A difference from the second embodiment and the fifth embodiment lies in that not only grooves 4b1 are formed within the scribe lines 5 on copper sheet 4z side but also grooves 1a are similarly formed within the scribe lines 5 on the semiconductor wafer (semiconductor substrate 1) side. Otherwise, the manufacturing method is the same as that for the semiconductor module explained in the second embodiment and the fifth embodiment.

Figure 18A:
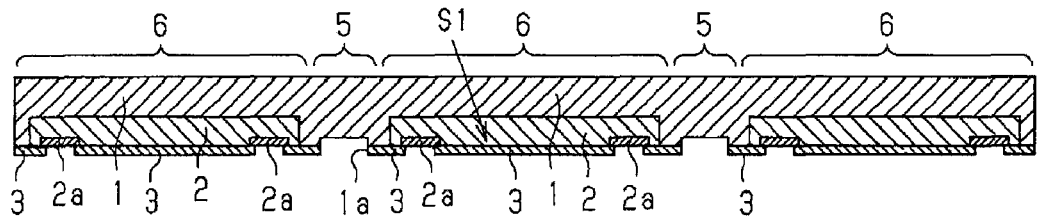
FIGS. 18A to 18D are schematic cross-sectional views for explaining a manufacturing process for a semiconductor module according to a sixth embodiment of the present invention.

Firstly, as illustrated in FIG. 18A, a semiconductor wafer with semiconductor substrates 1 formed in a matrix shape thereon, each semiconductor substrate 1 having electrodes 2a and protective film 3 at the surface S1 and grooves 1a within scribe lines 5, is prepared.

Figure 18B:
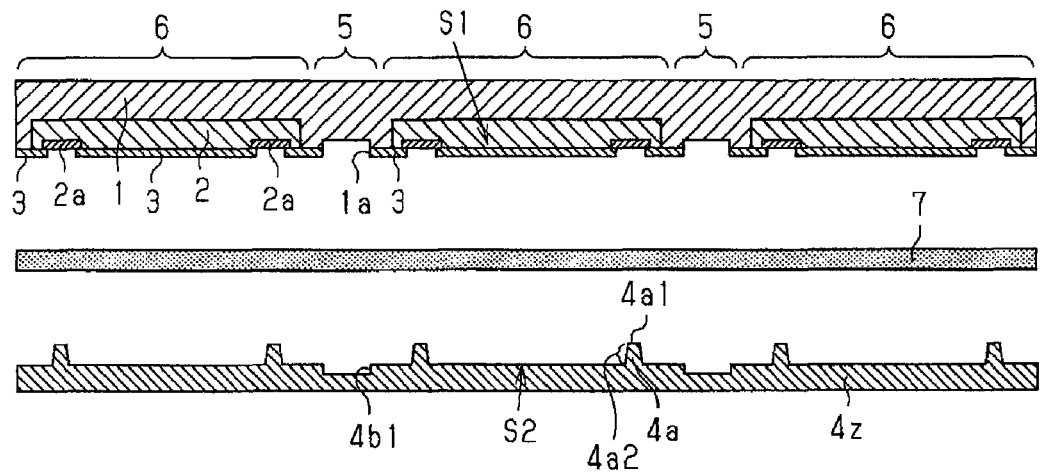

As illustrated in FIG. 18B, at the surface S1 (bottom side) of the semiconductor wafer (semiconductor substrate 1), an insulating layer 7 is held between the semiconductor substrate 1 having grooves 1a within the scribe lines 5 and a copper sheet 4z having bumps 4a formed integrally therewith and grooves 4b1 within the scribe lines 5. The common parts such as the semiconductor substrate 1, the insulating layer 7 and the copper sheet 4z are the same as those of the first embodiment.

Figure 18C:
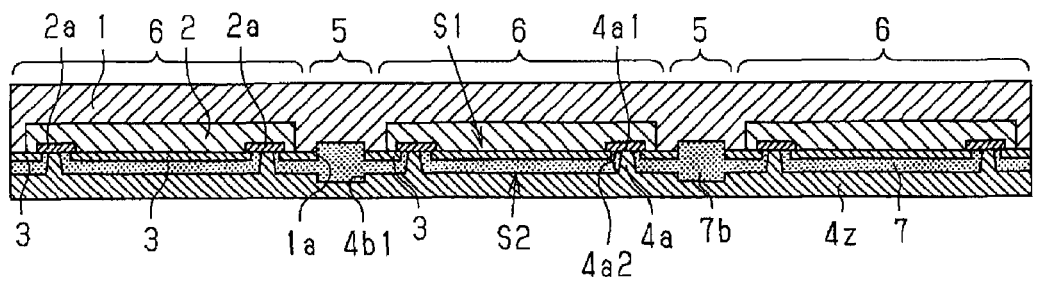

As illustrated in FIG. 18C, the semiconductor substrate 1, the insulating layer 7 and the copper sheet 4z, held together as described above, are now press-formed by a press machine into a single block. The press-forming conditions to be employed are the same as those of the second embodiment.

The press-forming causes a drop in viscosity of the insulating layer 7, which sets off plastic flow therein. As a result, the bumps 4a penetrate the insulating layer 7, thus electrically coupling the bumps 4a with the electrodes 2a of the semiconductor substrate 1. At the same time, extra material of the insulating layer 7 (insulating layer 7b) pushed out by the bumps 4a flows into both the grooves 4b1 and 1a provided in the scribe lines 5. All these make it possible to push insulating layer 7 effectively out of the interface between the bumps 4a and the electrodes 2a of the semiconductor substrate 1, thus making it harder for part of the insulating layer 7 to remain at the interface.

Figure 18D:
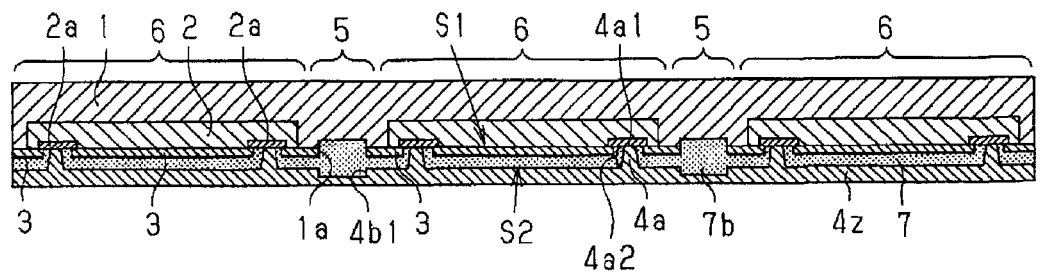

As illustrated in FIG. 18D, the copper sheet 4z is adjusted into the thickness of a rewiring pattern 4 by etching the whole of the copper sheet 4z from the opposite side of the main surface S2.

Figure 19A:
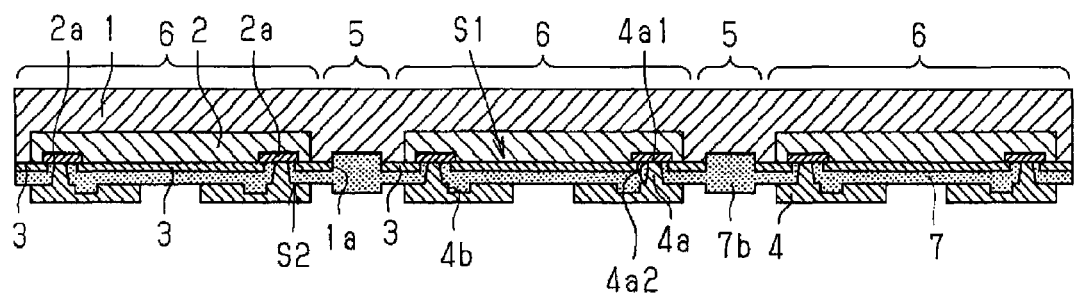
FIGS. 19A to 19C are schematic cross-sectional views for explaining a manufacturing process for a semiconductor module according to a sixth embodiment of the present invention.

Next, as illustrated in FIG. 19A, the copper sheet 4z is processed into a rewiring pattern (wiring layer) 4 with a predetermined line/space pattern, using a photolithography and etching process. In so doing, the insulating layer 7b with protrusion is formed within the scribe lines 5. The shape of the insulating layer 7b reflects that of the groove 4b1 exactly.

Figure 19B:
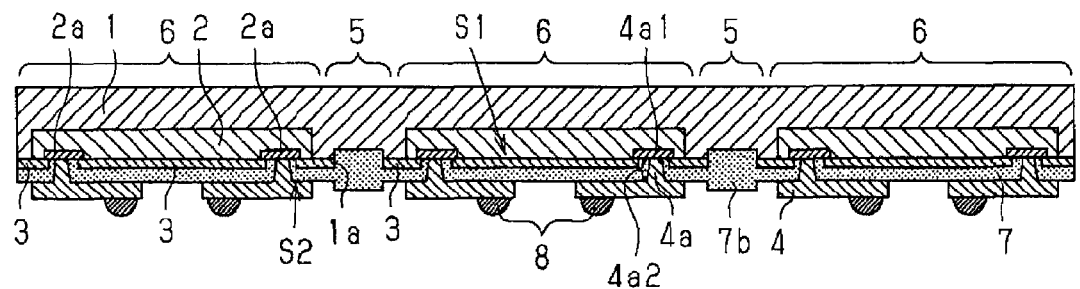

As illustrated in FIG. 19B, external connection electrodes (solder balls) 8, which function as external connection terminals for the parts of rewiring pattern 4 connected to the electrodes 2a via the bumps 4a, are formed by a solder printing process.

Figure 19C:
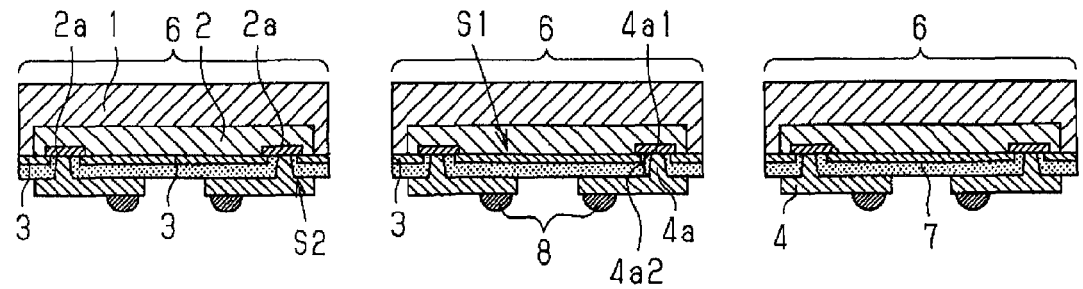

As illustrated in FIG. 19C, a semiconductor wafer is divided into individual semiconductor modules, each having the same outside dimensions as those of the semiconductor substrate 1, by dicing the semiconductor wafer from the back side (top side) thereof along the scribe lines 5 demarcating a plurality of semiconductor module forming regions 6. At this time, the insulating layer 7b with protrusion and the grooves 1a provided within the scribe lines 5 are removed, so that the insulating layer 7b and the grooves 1a no longer exist on the rewiring pattern (wiring layer) 4 of the individual semiconductor modules in the final form.

Through these processes, a semiconductor module of the sixth embodiment is manufactured.

The following advantageous effect is produced by the manufacturing method of a semiconductor module according to the sixth embodiment:

(9) Grooves (grooves 4b1 and grooves 1a) are provided within the scribe lines 5 on copper sheet 4z side and on the semiconductor substrate 1 side, so that extra part of the insulating layer 7, such as one pushed out by the bumps 4a, flows into both the grooves 4b1 and the grooves 1a. The probability that the residual film of insulating layer 7 will remain at the interface between the bumps 4a and the electrodes 2a is more effectively suppressed. As a result, it is possible to manufacture semiconductor modules with improved connection reliability between the bumps 4a and the electrodes 2a even more easily.

Seventh Embodiment

Figure 20:
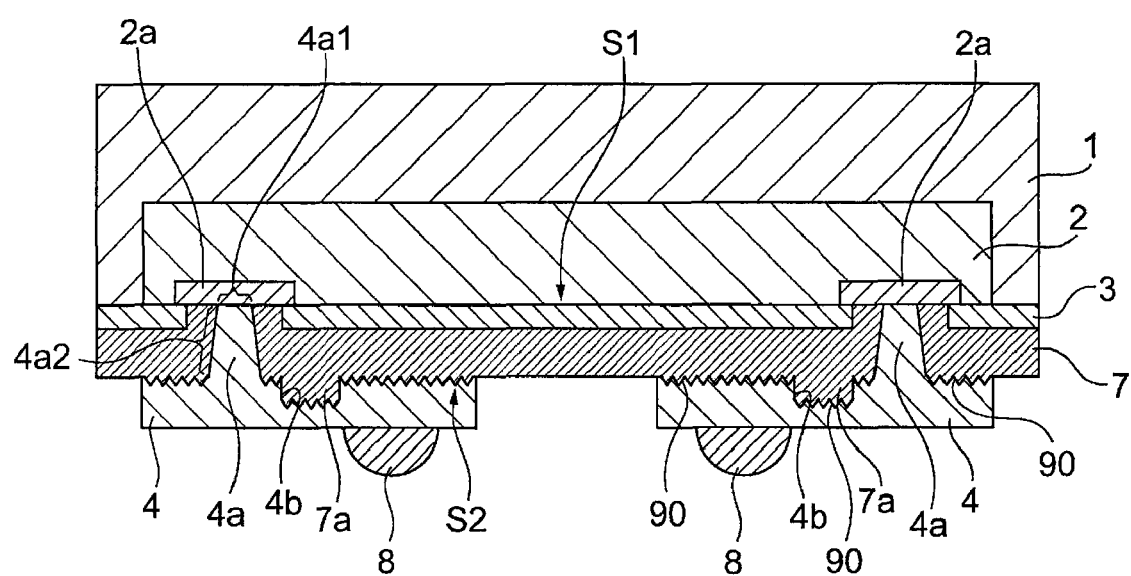
FIG. 20 is a schematic cross-sectional view showing a semiconductor module according to a seventh embodiment of the present invention.

FIG. 20 is a schematic cross-sectional view showing a semiconductor module according to a seventh embodiment of the present invention. The basic structure of the semiconductor module of this seventh embodiment is the same as that of the first embodiment. The description of the same components as those of the first embodiment will be omitted as appropriate.

As illustrated in FIG. 20, a semiconductor module according to the seventh embodiment has fine roughness or fine asperities 90 provided on the main surface S2 side of the rewiring pattern 4. The roughness of the fine asperities 90 is preferably a ten-point mean roughness (Rz) of 1 μm in the determination with a surface roughness tester.

The fine asperities 90 may be formed, for instance, by performing a roughening treatment on the surface of the rewiring pattern 4. The roughening treatment may be, for example, a chemical treatment, such as a CZ treatment (registered trademark), or a plasma treatment. The process for roughening the main surface S of the rewiring pattern 4 may be set after the process for removing the resist mask explained in the manufacturing process of a semiconductor module according to the first embodiment.

The following advantageous effect, in addition to those of the first embodiment, is produced by the semiconductor module according to the seventh embodiment:

(10) The fine asperities 90 are provided on the main surface S of the rewiring pattern 4, so that the anchor effect improves adhesion between the insulating layer 7 and the rewiring pattern 4.

Eighth Embodiment

Figure 21:
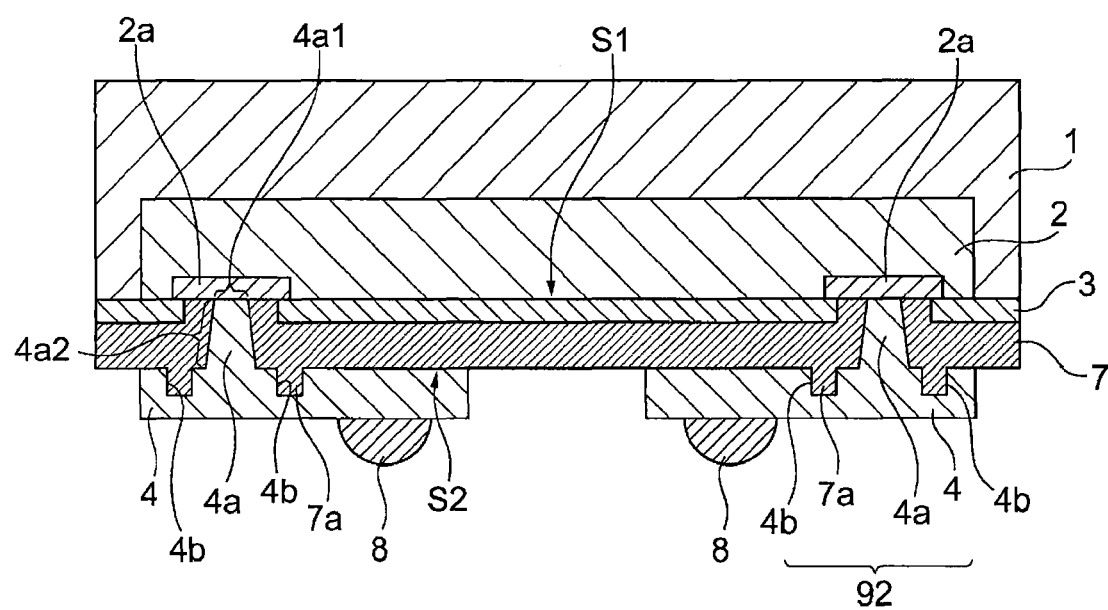
FIG. 21 is a schematic cross sectional view of a semiconductor module according to an eighth embodiment of the present invention.

FIG. 21 is a schematic cross sectional view of a semiconductor module according to an eighth embodiment of the present invention. The basic structure of the semiconductor module of this embodiment is the same as that of the first embodiment. The description of the same components as those of the first embodiment will be omitted as appropriate.

Figure 22:
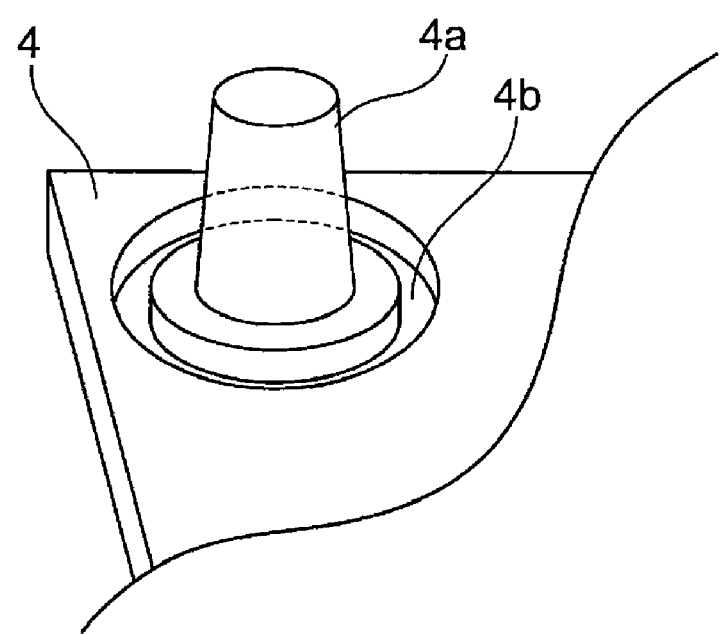
FIG. 22 is a perspective view of a groove forming part shown in FIG. 21 in the main surface of a wiring pattern.

FIG. 22 is a perspective view of a groove forming part 92 shown in FIG. 21 in the main surface S2 of the wiring pattern 4. As illustrated in FIG. 21 and FIG. 22, a semiconductor module according to the eighth embodiment has a circular groove 4b provided along the periphery of a bump 4a. The circular groove 4b such as this can be formed by performing an etching process using as the mask a resist mask having a circular opening surrounding the bump 4a in the process (see FIG. 3B) for forming grooves 4b in the copper sheet 4z explained in the manufacturing process of a semiconductor module of the first embodiment.

The following advantageous effect, in addition to those of the first embodiment, is produced by the semiconductor module according to the eighth embodiment:

(11) In the press-forming (see FIG. 5C) as explained in the first embodiment, the insulating layer 7 pushed out of the interface between the bumps 4a and the corresponding electrodes 2a of the semiconductor substrate 1 reliably flows into the grooves 4b provided along the periphery of the bumps 4a. As a result, there are far less possibilities that part of the insulating layer 7 will remain at the interface between the bumps 4a and the electrodes 2a of the semiconductor substrate 1.

Ninth Embodiment

Figure 23:
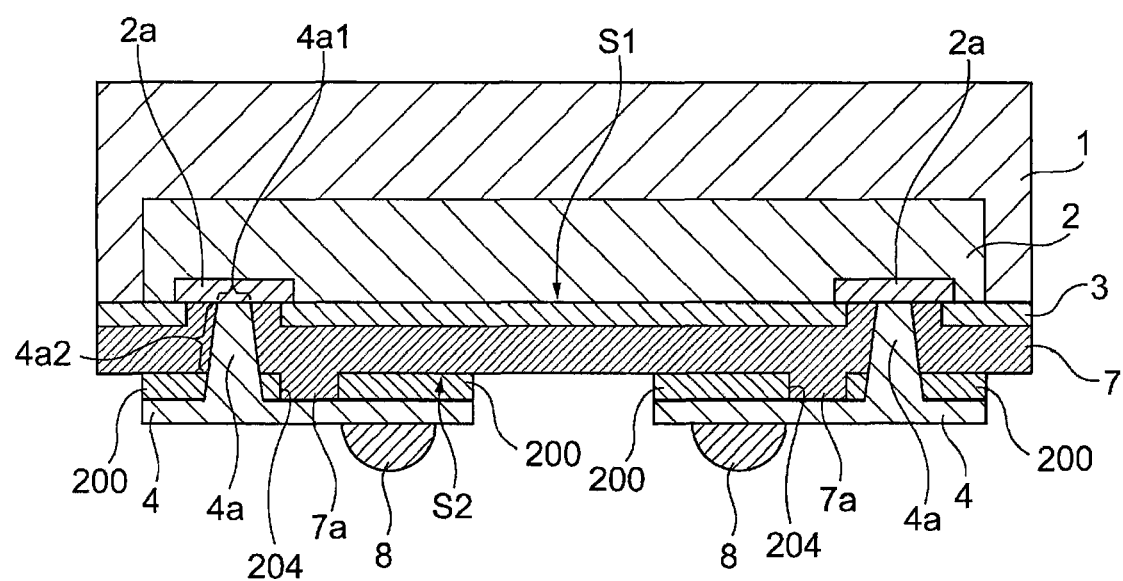
FIG. 23 is a schematic cross-sectional view of a semiconductor module according to a ninth embodiment of the present invention.

FIG. 23 is a schematic cross-sectional view of a semiconductor module according to a ninth embodiment of the present invention. The basic structure of the semiconductor module of this embodiment is the same as that of the first embodiment except that an intermediate layer 200 is provided between the rewiring pattern 4 and the insulating layer 7. Therefore, the description of the same components of the semiconductor module as those of the first embodiment will be omitted as appropriate.

As illustrated in FIG. 23, the semiconductor module according to the ninth embodiment has an intermediate layer 200 provided between the main surface S2 of the wiring pattern 4 and the insulating layer 7. The intermediate layer 200 is formed of an insulating material or a metallic material. The insulating material may be any as long as it retains its form without developing plastic flow at press-forming. The metallic material may be copper, for instance.

The intermediate layer 200 is provided with grooves 204. These grooves 204 correspond to the grooves 4b of the first embodiment.

The intermediate layer 200 such as this may be formed by performing a process as described below after the process (see FIG. 2C) for forming bumps 4a on the main surface S2 of the copper sheet 4z explained in the manufacturing process of a semiconductor module of the first embodiment.

Figure 24A:
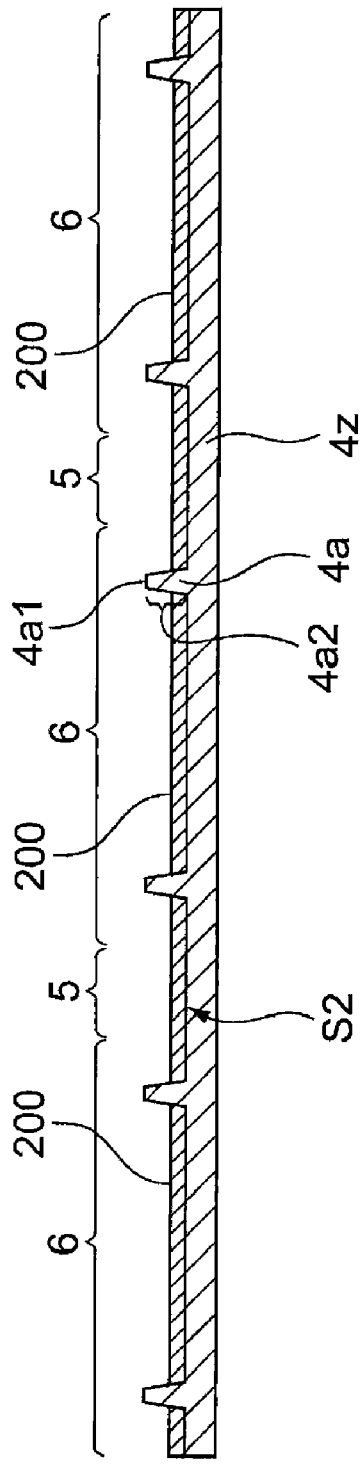
FIGS. 24A and 24B are cross sectional view for explaining a method for forming an intermediate layer that constitutes a semiconductor module according to a night embodiment of the present invention.

FIGS. 24A and 242B are cross sectional view for explaining a method for forming an intermediate layer 200 that constitutes a semiconductor module according to the night embodiment of the present invention.

Firstly, as illustrated in FIG. 24A, an intermediate layer 200 is formed on the main surface S2 of a wiring pattern 4 except where the bumps 4a exist. The thickness of the intermediate layer 200 may be about 15 μm, for instance. Note also that the thickness of the intermediate layer 200 is equal to the depth of grooves 204 to be discussed later. Hence, the thickness of the intermediate layer 200 may be changed as appropriate according to the depth of the grooves 204. When the intermediate layer 200 is of an insulating material, it can be formed by laminating a resin sheet. When the intermediate layer 200 is of a metal, such as copper, it can be formed by using a plating process. When a plating process is used, a mask may be applied to the bumps 4a in advance, and the bumps 4a may be exposed from the intermediate layer 200 by removing the mask after the plating process.

Figure 24B:
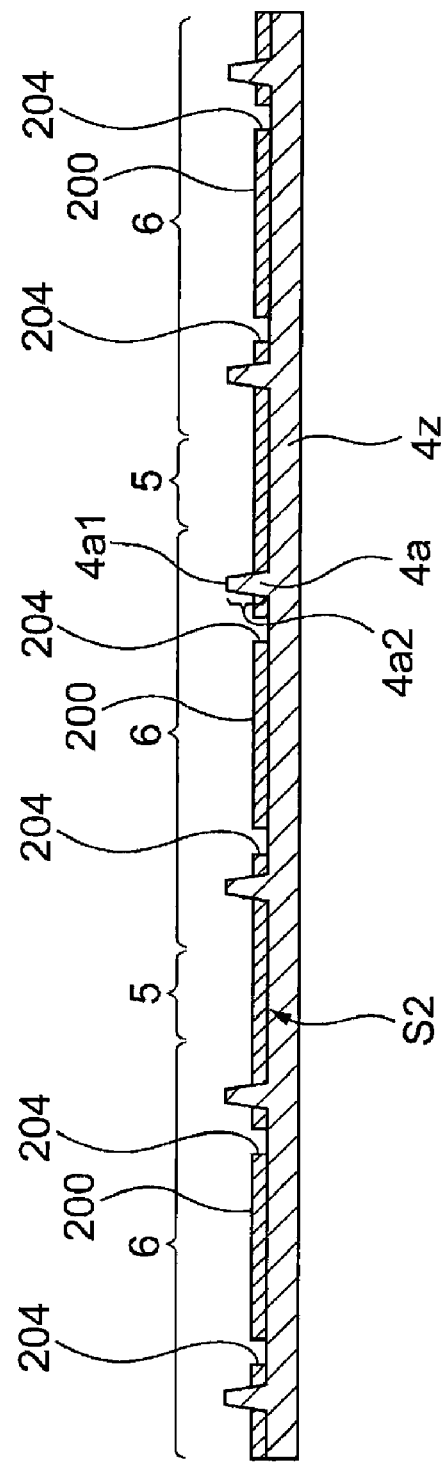

Then, as illustrated in FIG. 24B, an etching process is performed on the intermediate layer 200, using a resist mask (not shown) as the mask, and thus grooves 204 of a predetermined pattern are formed in the intermediate layer 200. Here, the depth of the grooves 204 is about 15 μm, and the grooves 204 are provided in the vicinity of the bumps 4a.

After this, the processes similar to those shown in FIGS. 5A to 5D and FIGS. 6A to 6C of the first embodiment may be performed to manufacture a semiconductor module as shown in FIG. 23.

The following advantageous effect, in addition to those of the first embodiment, is produced by the semiconductor module according to the ninth embodiment:

(12) An intermediate layer having a thickness equal to the depth of the grooves is formed in advance, so that it is easy to form the grooves to a desired depth. This makes it possible to form the grooves reproducibly and stably, and as a result, the production cost of the semiconductor module can be reduced.

Tenth Embodiment

Next, a description will be given of a mobile apparatus (portable device) provided with a semiconductor module according to an embodiment. The mobile apparatus presented as an example herein is a mobile phone, but it may be any electronic apparatus, such as a personal digital assistant (PDA), a digital video cameras (DVC) or a digital still camera (DSC).

Figure 25:
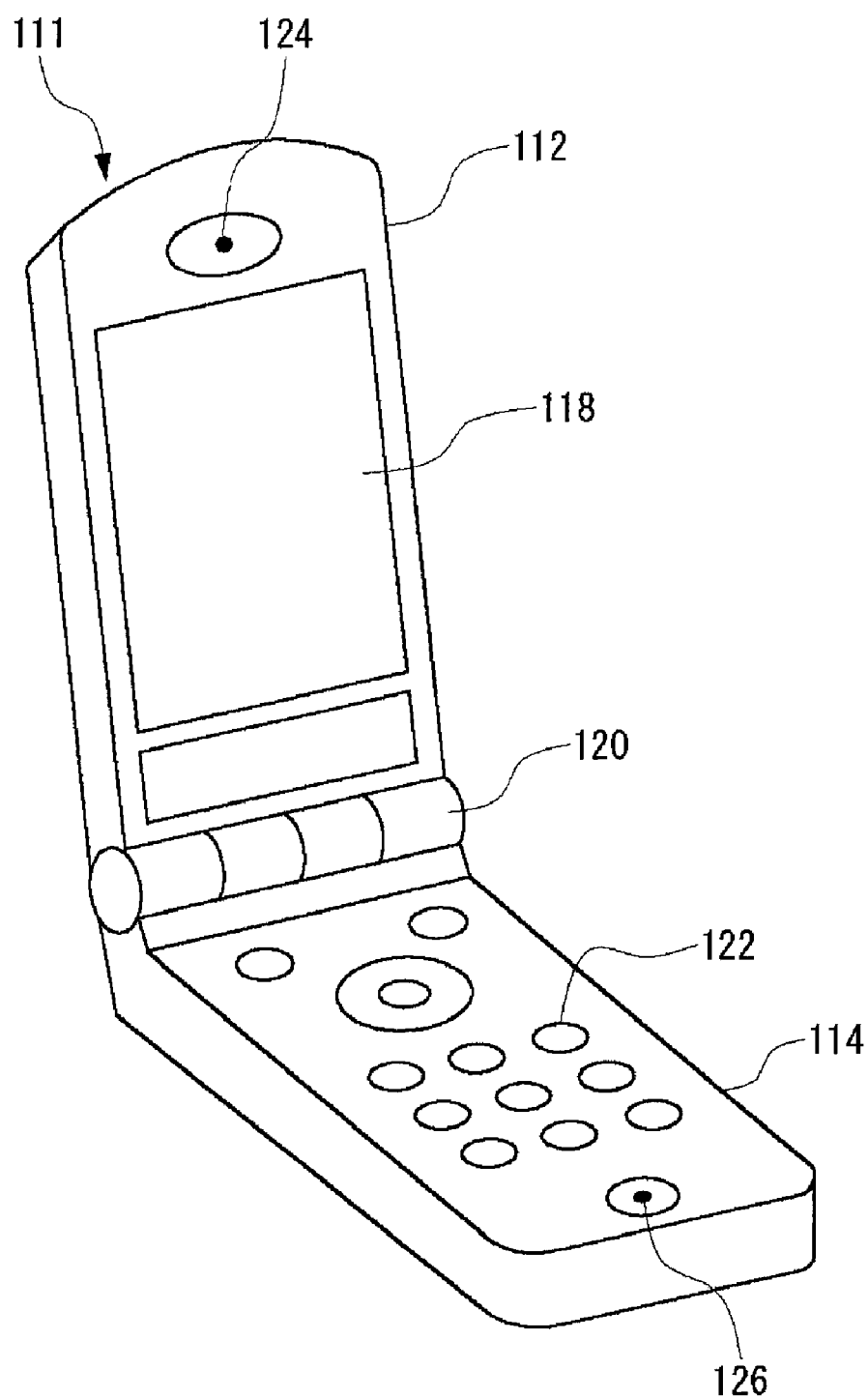
FIG. 25 illustrates a structure of a mobile phone provided with a semiconductor module according to a tenth embodiment.

FIG. 25 illustrates a structure of a mobile phone provided with a semiconductor module according to the preferred embodiments of the present invention. A mobile phone 110 has a basic structure of a first casing 112 and a second casing 114 jointed together by a movable part 120. The first casing 112 and the second casing 114 are turnable/rotatable around the movable part 120 as the axis. The first casing 112 is provided with a display unit 118 for displaying characters, images and other information and a speaker unit 124. The second casing 114 is provided with a control module 122 with operation buttons and a microphone 126. Note that a semiconductor module according to the preferred embodiments of the present invention is mounted within a mobile phone 110 such as this.

Figure 26:
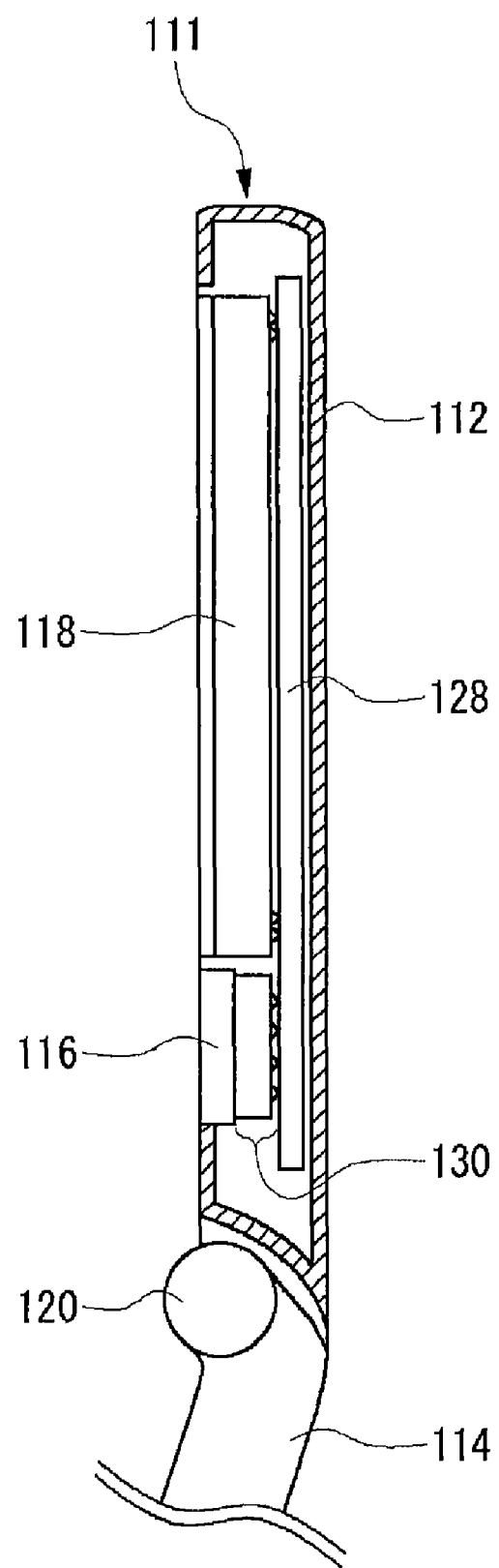
FIG. 26 is a partially schematic cross-sectional view (cross-sectional view of a first casing) of a mobile phone shown in FIG. 25.

FIG. 26 is a partially schematic cross-sectional view (cross-sectional view of a first casing 112) of the mobile phone shown in FIG. 25. A semiconductor module 130 according to any of the preferred embodiments of the present invention is mounted on a printed circuit board 128 via external connection electrodes 9, and is coupled electrically to a display unit 118 and the like by way of the printed circuit board 128. Also, a radiating substrate 116, which may be a metallic substrate, is provided on the back side of the semiconductor module 130 (opposite side of external connection electrodes 9), so that the heat generated from the semiconductor module 130, for example, can be efficiently released outside the first casing 112 without getting trapped therein.

The following advantageous effects are produced by the mobile apparatus provided with the semiconductor module according to the embodiments:

(13) The connection reliability between the bump 4a and the electrode 2a is improved and thereby the connection reliability of the semiconductor module 130 is improved. As a result, the reliability of the mobile apparatus with such a semiconductor module 130 mounted thereon is improved.

(14) The manufacturing cost of the semiconductor module 130 is reduced, so that the manufacturing cost of the mobile apparatus that mounts such a semiconductor module 130 thereon can be suppressed.

(15) The semiconductor module 130 manufactured by a wafer-level CSP (Chip Size Package) as described in the above embodiments is madder thinner and smaller. Hence, the mobile apparatus that mounts such a semiconductor module 130 can be madder thinner and smaller.

The present invention is not limited to the above-described embodiments only, and it is understood by those skilled in the art that various modifications such as changes in design may be made based on their knowledge and the embodiments added with such modifications are also within the scope of the present invention. For example, the structure of each embodiment may be combined as appropriate.

As an example presented in the second embodiment, the grooves 4b1 are formed in a matrix in such a manner that they surround the semiconductor module forming regions 6 (semiconductor substrates 1) along the scribe lines 5. However, the present embodiments are not limited thereto, and a plurality of isolated slit-like grooves, for instance, may be provided repeatedly along the scribe lines 5. In this case, too, the above-described advantageous effects can be achieved.

As an example presented in the foregoing embodiments, the bump 4a on the copper sheet 4z is so formed that it is circular or round-shaped with the diameter smaller toward the head portion 4a1. However, the present embodiments are not limited thereto, and the bump may be, for instance, in the shape of a cylinder with a predetermined diameter. Also, the bump 4a may be polygonal, such as quadrangular, instead of round. In such a case, too, the grooves provided in the copper sheet work in such a manner that extra part of the insulating layer 7, such as one pushed out by the bumps 4a, flows into the grooves. As a result, the probability that the residual film of insulating layer 7 will remain at the interface between the bumps 4a and the electrodes 2a is suppressed. Thus, the connection reliability of the semiconductor module can be improved.

As an example presented in the foregoing embodiments, with the purpose of having the pitch of the electrodes 2a of the semiconductor substrate 1 (circuit element 2) wider, the copper sheet 4z, the insulating layer 7 and the circuit element 2 are stacked in such a manner that the bumps 4a are embedded in the insulating layer 7, and the rewiring pattern (wiring layer) 4 is formed and the external connection electrodes (solder balls) 8 are formed on the back side thereof. However, the present embodiments are not limited thereto, and a multilayer structure may be constructed, for instance, by forming a wiring layer repeatedly using a copper sheet having bumps and grooves. Such an arrangement can achieve a buildup of multilayer wiring easily and, at the same time, improve the connection reliability within the multilayer wiring and the connection reliability between the multilayer wiring and the circuit element.

While the preferred embodiments of the present invention have been described using specific terms, such description is for illustrative purposes only, and it is to be understood that changes and variations may be made without departing from the spirit or scope of the appended claims.

What is claimed is:

1. A method for manufacturing a semiconductor module, the method comprising:
    a first process of preparing a semiconductor substrate in which a circuit element and an electrode electrically connected to the circuit element are provided on a surface thereof;
    a second process of forming a metal sheet having a bump on a main surface and a first groove provided on the main surface, the bump being integrated with the main surface and the first groove being depressed with respect to the main surface, wherein the bump is contiguously and seamlessly integrated with the main surface; and
    a third process of press-bonding the metal sheet and the semiconductor substrate by way of an insulating layer and electrically connecting the bump with the electrode in a manner such that the bump penetrates the insulating layer wherein, in the third process, the insulating layer, which is pushed out by the bump as the bump penetrates the insulating layer, flows into the first groove.

2. A method for manufacturing a semiconductor module according to claim 1, wherein a plurality of the circuit elements are formed on the semiconductor substrate, and
    wherein the first groove is prepared on a scribe region which is so provided as to demarcate the plurality of circuit elements.

3. A method for manufacturing a semiconductor module according to claim 2, wherein the electrode is provided in a peripheral part of the circuit element.

4. A method for manufacturing a semiconductor module according to claim 1, further comprising a fourth process of forming a wiring layer having a predetermined line/space pattern by processing the metal sheet,
    wherein the first groove is formed in a shape corresponding to the space pattern of the wiring layer, and the wiring layer is formed by making the metal sheet thinner from a rear surface thereof.

5. A method for manufacturing a semiconductor module according to claim 1, wherein the first groove is formed by penetrating the metal sheet.

6. A method for manufacturing a semiconductor module according to claim 1, wherein a second groove is further formed on the surface of the semiconductor substrate in said first process.

7. A method for manufacturing a semiconductor module, the method comprising:
- a first process of preparing a semiconductor substrate in which a circuit element, an electrode electrically connected to the circuit element and a groove are provided on a surface thereof, wherein the groove is formed in the semiconductor substrate;
- a second process of forming a metal sheet having a bump, wherein the bump is contiguously and seamlessly integrated with a main surface of the metal sheet; and
- a third process of press-bonding the metal sheet and the semiconductor substrate by way of an insulating layer and electrically connecting the bump with the electrode in a manner such that the bump penetrates the insulating layer.

* * * * *